United States Patent
Majidi et al.

(10) Patent No.: US 11,923,103 B2
(45) Date of Patent: Mar. 5, 2024

(54) STRETCHABLE ELECTRONICS AND METHODS OF MAKING THE SAME

(71) Applicant: Carnegie Mellon University, Pittsburgh, PA (US)

(72) Inventors: Carmel Majidi, Pittsburgh, PA (US); Chengfeng Pan, Pittsburgh, PA (US); Kitty Kumar, Vancouver (CA)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 505 days.

(21) Appl. No.: 17/240,281

(22) Filed: Apr. 26, 2021

(65) Prior Publication Data

US 2021/0265074 A1 Aug. 26, 2021

Related U.S. Application Data

(62) Division of application No. 16/750,563, filed on Jan. 23, 2020, now Pat. No. 11,017,915.

(60) Provisional application No. 62/918,263, filed on Jan. 23, 2019.

(51) Int. Cl.
| | |
|---|---|
| H05K 1/02 | (2006.01) |
| C25D 1/04 | (2006.01) |
| C25D 5/02 | (2006.01) |
| C25D 5/56 | (2006.01) |
| H01B 1/12 | (2006.01) |
| H01B 1/22 | (2006.01) |
| H05K 1/03 | (2006.01) |
| H05K 3/02 | (2006.01) |

(52) U.S. Cl.
CPC ............. *H01B 1/12* (2013.01); *C25D 1/04* (2013.01); *C25D 5/022* (2013.01); *C25D 5/56* (2013.01); *H01B 1/22* (2013.01); *H05K 1/0393* (2013.01); *H05K 3/027* (2013.01); *H05K 2201/0108* (2013.01); *H05K 2203/107* (2013.01)

(58) Field of Classification Search
CPC ............. H05K 1/0283; H05K 3/027; H05K 2201/0108; H05K 2203/107; H01B 1/22
See application file for complete search history.

(56) References Cited

U.S. PATENT DOCUMENTS

| | | | |
|---|---|---|---|
| 2016/0170447 A1* | 6/2016 | Dutta | H01F 41/046 428/152 |
| 2018/0283844 A1* | 10/2018 | Kamakura | G01B 7/18 |
| 2019/0013111 A1* | 1/2019 | Yonekura | H01B 1/02 |

(Continued)

OTHER PUBLICATIONS

Abduev, A. et al., A Revised Growth Model for Transparent Conducting Ga Doped ZnO Films: Improving Crystallinity by Means of Buffer Layers, Plasma Processes and Polymers, 2015, vol. 12, p. 725-733.

(Continued)

*Primary Examiner* — Hoa C Nguyen
(74) *Attorney, Agent, or Firm* — Dentons Cohen & Grigsby P.C.

(57) ABSTRACT

A stretchable and transparent electronic structure may generally include a stretchable elastomer layer; optionally, a metal adhesion layer on top of the stretchable elastomer layer; a metal alloying layer on top of the metal adhesion layer; and a liquid metal, wherein the structure is colorless and transparent when viewed under visible light. Methods of making the stretchable and transparent electronic structure are also described.

20 Claims, 11 Drawing Sheets

(56) References Cited

U.S. PATENT DOCUMENTS

| | | | | |
|---|---|---|---|---|
| 2019/0082532 | A1* | 3/2019 | Majidi | A61B 5/6825 |
| 2019/0215965 | A1* | 7/2019 | Majidi | H05K 1/09 |
| 2019/0327829 | A1* | 10/2019 | Ogura | H05K 1/0283 |
| 2020/0281073 | A1* | 9/2020 | Okimoto | H05K 1/189 |

OTHER PUBLICATIONS

Kim, M.S. et al., While top-emitting organic light-emitting diodes using one-emissive layer of the DCJTB doped DPVBi ayer, This Solid Films, 2008, vol. 516, p. 3590-3594.

Ewis, Jay, Material challenge for flexible organic devices, Materials Today, Apr. 2006, vol. 9, No. 4, p. 38-45.

Gorrn, P. et al., Towards See-Through Displays: Fully Transparent Thin-Film Transistors Driving Transparent Organic Light-Emitting Diodes, Advanced Materials, 2006, vol. 18, p. 738-741.

Savagatrup, S. et al., Plasticization of PEDOT:PSS by Common Additives for Mechanically Robust Organic Solar: Cells and Wearable Sensors, Advanced Functional Materials, 2015, vol. 25, p. 427-436.

Stoppa, M. et al., Wearable Electronics and Smart Textiles: A Critical Review, Sensors, 2014, vol. 14, p. 11957-11992.

Armstrong, N. et al., Oxide Contacts in Organic Photovoltaics: Characterization and Control of Near-Surface: Composition in Indium-Tin Oxide (ITO) Electrodes, Accounts of Chemical Research, Nov. 2009, vol. 42, No. 11, p. 1748-1757.

Park, Y. et al., Room temperature flexible and transparent ITO/Ag/ITO electrode grown on flexible PES substrate by: continuous roll-to-roll sputtering for flexible organic photovoltaics, Journal of Physics D: Applied Physics, 2009, vol. 42, p. 235109.

Kim, C. et al., Highly stretchable, transparent ionic touch panel, Science, Aug. 12, 2016, vol. 353, Issue 6300, p. 582-687.

Keplinger, C. et al., Stretchable, Transparent, Ionic Conductors, Science, Aug. 30, 2013, vol. 341, p. 984-987.

Liang, J_ et al., Elastometric polymer light-emitting devices and displays, Nature Photonics, Oct. 2013, vol. 7, p. 817-824.

Seikitani, T. et al., Stretchable active-matrix organic light-emitting diode display using printable elastic conductors, Nature Materials, Jun. 2009, vol. 8, p. 494-499.

Vasquez Quintero, A. et al., Stretchable Electronic Platform for Soft and Smart Contact Lens Applications, Advanced Materials Technologies, 2017, vol. 1, p. 1700073.

Cloherty, S. et al., Focal Activation of Primary Visual Cortex Following Supra-choroidal Electrical Stimulation of the Retina: Intrinsic Signal Imaging and Linear Model Analysis, 32nd Annual International Conference of the IEEE EMBS, Bueno Aires, Argentina, 2010, p. 6765-6768.

Lipomi, D. et al., Skin-like pressure and strain sensors based on transparent elastic films of carbon nanotubes, Nature Nanotechnology, Dec. 2011, vol. 6, p. 788-792.

Yu, Z. et al., Intrinsically Stretchable Polymer Light-Emitting Devices Using Carbon Nanotube-Polymer Composite Electrodes, Advanced Materials, 2011, vol. 23, p. 3989-3994.

Kim, K. et al., Single-Walled Carbon Nanotube Aerogel-Based Elastic Conductors, Advanced Materials, 2011, vol. 23, p. 2865-2869.

Kim, K. et al., Large-scale pattern growth of graphene films for stretchable transparent electrodes, Nature Letters, Feb. 2009, vol. 457, No. 5, p. 706-710.

Hu, W. et al., Intrinsically stretchable transparent electrodes based on silver-nanowire-crosslinked-polyacrylate composites, Nanotechnology, 2012, vol. 23, p. 344002.

Hu, W. et al., An elastomeric transparent composite electrode based on copper nanowires and polyurethane, Journal of Materials Chemistry C, 2014, vol. 2, p. 1298-1305.

McCoul, D. et al., Recent Advances in Stretchable and Transparent Electronic Materials, Advanced Electronic Materials, 2016, vol. 2, p. 1500407.

Nu, H. et al., Electrospun Metal Nanofiber Webs as High-Performance Transparent Electode, Nano Letters, 2010, vol. 10, p. 4242-4248.

Nu, H. et al., A transparent electrode based on a metal nanotrough network, Nature Nanotechnology, Jun. 2013, vol. 8, p. 421-425.

Guo, C. et al., Highly stretchable and transparent nanomesh electrodes made by grain boundary lithography, Nature Communications, Jan. 28, 2014, vol. 5, p. 3121.

Gao, T. et al., Uniform and Ordered Copper Nanomeshes by Microsphere Lithography for Transparent Electrodes, Nano Letters, 2014, vol. 14, p. 2105-2110.

Dickey, Michael D., Stretchable and Soft Electronics using Liquid Metals, Advanced Materials, 2017, vol. 29, p. 1606425.

Kubo, M. et al., Stretchable Microfluidic Radiofrequency Antennas, Advanced Materials, 2010, vol. 22, p. 2749-2752.

Boley, J_ et al., Direct Writing of Gallium-Indium Alloy for Stretchable Electronics, Advanced Functional Materials, J014, vol. 24, p. 3501-3507.

Chiolerio, A. et al., Smart Fluid Systems: The Advent of Autonomous Liquid Robotics, Advanced Science, 2017, vol. 4, p. 1700036.

Moon, Y. et al., Freely Deformable Liquid Metal Grids as Stretchable and Transparent Electrodes, IEEE Transactions on Electron Devices, Dec. 2017, vol. 64, No. 12, p. 5157-5162.

Levien, Raphael, Resolution-dependence of perceived contrast of textures, Proceedings of SPIE, 2004, San Jose, Califomia, p. 405-412.

Curcio, C. et al., Human Photoreceptor Topography, The Journal of Comparative Neurology, 1990, vol. 292, p. 197-523.

Gozen, B. et al., High-Density Soft-Matter Electronics with Micron-Scale Line Width, Advanced Materials, 2014, vol. 26, p. 5211-5216.

Joshipura, I. et al., Methods to pattern liquid metals, Journal of Materials Chemistry C, 2015, vol. 3, p. 3834-3841.

Khondoker, M.A.H. et al., Fabrication methods and applications of microstructured gallium based liquid metal alloys, Smart Materials and Structures, 2016, vol. 25, p. 093001.

Li, G. et al., Selectively plated stretchable liquid metal wires for transparent electronics, Sensors and Actuators B, J015, vol. 221, p. 1114-1119.

Kim, H. et al., A Biaxial Stretchable Interconnect with Liquid-Alloy-Covered Joints on Elastomeric Substrate, Journal of Microelectromechanical Systems, Feb. 2009, vol. 18, No. 1, p. 138-146.

Hirsh, A. et al., Intrinsically Stretchable Biphasic {Solid-Liquid) Thin Metal Films, Advanced Materials, 2016, vol. 28, p. 4507-4512.

U, T. et al., Soft-Matter Printed Circuit Board with UV Laser Micropatterning, Applied Materials & Interfaces, 2017, vol. 9, p. 22055-22062.

Sugioka, K. et al., Ultrafast lasers—reliable tools for advanced materials processing, Light: Science & Applications, J014, vol. 3, e149.

Haacke, G., New figure of merit for transparent conductors, Journal of Applied Physics, Sep. 9, 1976, vol. 47, No. 9, p. 4086-4089.

Chen, Z. et al., Fabrication of Highly Transparent and Conductive Indium-Tin Oxide Thin Films with a High Figure of Merit via Solution Processing, Langmuir, 2013, vol. 29, p. 13836-13842.

Pan, C. et al., Visually Imperceptible Liquid-Metal Circuits for Transparent, Stretchable Electronics with Direct Laser Writing, Advanced Materials, Feb. 218, p. 706937.

* cited by examiner

| Legend | Line Width (μm) | Pitch (μm) | LM Filling Fraction (%) | Laser System |
|---|---|---|---|---|
| ◯ | 52.8 | 500 | 10.56 | LPKF |
|  | 51.3 | 250 | 21.11 |  |
|  | 52.1 | 167 | 31.60 |  |
|  | 52.6 | 125 | 42.22 |  |
| △ | 4.35 | 96 | 4.53 | Lumera |
|  | 4.01 | 50.7 | 7.91 |  |
|  | 4.78 | 27.9 | 17.10 |  |
|  | 4.66 | 17.5 | 26.63 |  |

STRETCHABLE ELECTRONICS AND METHODS OF MAKING THE SAME

CROSS REFERENCE TO RELATED APPLICATION

This application is a divisional of U.S. patent application Ser. No. 16/750,563, filed Jan. 23, 2020, now U.S. Pat. No. 11,017,915, which claims the benefit of U.S. Provisional Application No. 62/918,263, filed Jan. 23, 2019, the disclosure of each of which is incorporated herein by reference in its entirety.

GOVERNMENT RIGHTS

This invention was made with government support under NASA No. NNX14A049G. The government has certain rights in this invention.

TECHNICAL FIELD

This disclosure generally relates to stretchable electronics comprising a liquid metal coating on a stretchable substrate as well as methods of making and using the same.

BACKGROUND

Transparent conducting films (TCFs) may generally comprise thin films of optically transparent and electrically conductive material. TCFs may be used in flexible optoelectronic devices, such as flexible display panels, touch control panels, electronic papers, solar cells and smart windows and devices having nonplanar or curvilinear surfaces. An example of a flexible TCF is a composite film formed by sputtering indium tin oxide (ITO) onto a transparent polymer substrate. However, conventional flexible TCFs may suffer from one or more of the following limitations: low transmittance and/or transparency (under visible light), high brittleness, poor flexibility, short bending fatigue life, complex and/or expensive fabrication, and raw material sacristy and/or cost. Further, conventional flexible TCFs may pose manufacturing challenges when attempting to achieve a thickness that sufficiently withstands the mechanical deformation when stretched to resist rupture while maintaining conductivity.

Accordingly, it may be desirable to provide stretchable electronics having improved stretchability, transmittance, and/or transparency as well as methods of making and using the same.

BRIEF DESCRIPTION OF THE FIGURES

The stretchable electronics described herein may be better understood by considering the following description in conjunction with the accompanying drawings; it being understood that this disclosure is not limited to the accompanying drawings.

(FIG. 12C) Electromechanical response of the sample when cyclically strained to maximum strain of 50% over ten cycles in longitudinal (top) and transverse (bottom) direction. (FIG. 12D) Resistance of the conductor at 50% elongation in longitudinal ($\varepsilon x$) and transverse ($\varepsilon y$) direction and in-between relaxed states over 3000 cycles.

DETAILED DESCRIPTION

Figure 1:
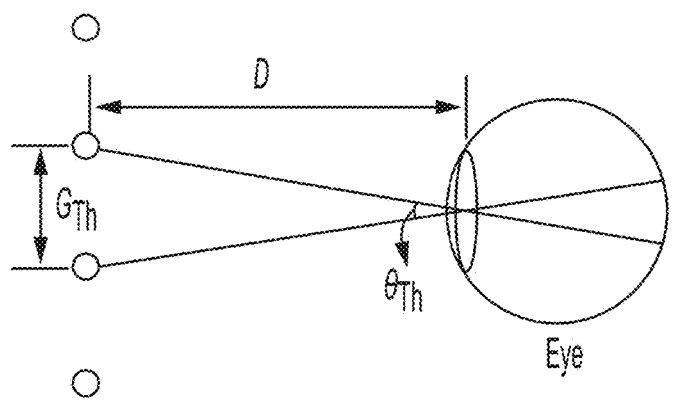
FIG. 1 includes a schematic showing various geometric parameters used for calculating grating acuity threshold ($G_{Th}$).

This disclosure generally describes stretchable electronics comprising a liquid metal coating on a stretchable substrate having improved stretchability, transmittance, and/or transparency as well as methods of making and using the same. It is understood, however, that this disclosure also embraces numerous alternative features, aspects, and advantages that may be accomplished by combining any of the various features, aspects, and/or advantages described herein in any combination or sub-combination that one of ordinary skill in the art may find useful. Such combinations or sub-combinations are intended to be included within the scope of this disclosure. As such, the claims may be amended to recite any features, aspects, and advantages expressly or inherently described in, or otherwise expressly or inherently supported by, this disclosure. Further, any features, aspects, and advantages that may be present in the prior art may be affirmatively disclaimed. Accordingly, this disclosure may comprise, consist of, consist essentially or be characterized by one or more of the features, aspects, and advantages described herein. As used herein, the term "and/or" includes any and all combinations of one or more of the associated listed items.

All numerical quantities stated herein are approximate, unless stated otherwise. Accordingly, the term "about" may be inferred when not expressly stated. The numerical quantities disclosed herein are to be understood as not being strictly limited to the exact numerical values recited. Instead, unless stated otherwise, each numerical value stated herein is intended to mean both the recited value and a functionally equivalent range surrounding that value. At the very least, and not as an attempt to limit the application of the doctrine of equivalents to the scope of the claims, each numerical value should at least be construed in light of the number of reported significant digits and by applying ordinary rounding techniques. Notwithstanding the approximations of numerical quantities stated herein, the numerical quantities described in specific examples of actual measured values are reported as precisely as possible. Any numerical values, however, inherently contain certain errors necessarily resulting from the standard deviation found in their respective testing measurements.

All numerical ranges stated herein include all sub-ranges subsumed therein. For example, a range of "1 to 10" or "1-10" is intended to include all sub-ranges between and including the recited minimum value of 1 and the recited maximum value of 10 because the disclosed numerical ranges are continuous and include every value between the minimum and maximum values. Any maximum numerical limitation recited herein is intended to include all lower numerical limitations. Any minimum numerical limitation recited herein is intended to include all higher numerical limitations.

All compositional ranges stated herein are limited in total to and do not exceed 100 percent (e.g., volume percent or weight percent) in practice. When multiple components may be present in a composition, the sum of the maximum amounts of each component may exceed 100 percent, with the understanding that, and as those skilled in the art would readily understand, that the amounts of the components may be selected to achieve the maximum of 100 percent.

In the following description, certain details are set forth in order to provide a better understanding of various features, aspects, and advantages the invention. However, one skilled in the art will understand that these features, aspects, and advantages may be practiced without these details. In other instances, well-known structures, methods, and/or techniques associated with methods of practicing the various features, aspects, and advantages may not be shown or described in detail to avoid unnecessarily obscuring descriptions of other details of the invention.

The terminology used herein is for the purpose of describing particular examples only and is not intended to be limiting. As used herein, the singular forms "a", "an", and "the" may be intended to include the plural forms as well, unless the context clearly indicates otherwise. The terms "comprises", "comprising", "including", "having", and "characterized by", are inclusive and therefore specify the presence of stated features, elements, compositions, steps, integers, operations, and/or components, but do not preclude the presence or addition of one or more other features, integers, steps, operations, elements, components, and/or groups thereof. Although these open-ended terms are to be understood as a non-restrictive term used to describe and claim various aspects set forth herein, in certain aspects, the term may alternatively be understood to instead be a more limiting and restrictive term, such as "consisting of" or "consisting essentially of". Thus, for any given embodiment reciting compositions, materials, components, elements, features, integers, operations, and/or process steps, described herein also specifically includes embodiments consisting of, or consisting essentially of, such recited compositions, materials, components, elements, features, integers, operations, and/or process steps. In the case of "consisting of", the alternative embodiment excludes any additional compositions, materials, components, elements, features, integers, operations, and/or process steps, while in the case of "consisting essentially of", any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). The functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on", "engaged to", "connected to", or "coupled to" another element or layer, it may be directly on, engaged, connected or coupled to the other component, element, or layer, or intervening elements or layers may be present. In contrast, when an element is referred to as being "directly on", "directly engaged to", "directly connected to", or "directly coupled to" another element or layer, there may be no intervening elements or layers present. Other words used to describe the relationship between elements should be interpreted in a like fashion (e.g., "between" versus "directly between", "adjacent" versus "directly adjacent", etc.).

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first", "second", and other numerical terms when used herein may not imply a sequence or order unless clearly indicated by the context. Thus, a first step, element, component, region, layer or section discussed below may be termed a second step, element, component, region, layer or section without departing from the teachings herein.

Spatially or temporally relative terms, such as "before", "after", "inner", "outer", "beneath", "below", "lower", "above", "upper", and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures. As used herein, "top" means furthest away from the substrate, while "bottom" means closest to the substrate. Where a first layer is described as "disposed over", "provided over", or "deposited over" a second layer, the first layer is disposed further away from substrate. There may be other layers between the first and second layer, unless it is specified that the first layer is "in contact with", "disposed on", "provided on", or "deposited on" the second layer.

As used herein "ultraviolet light", "ultraviolet radiation", "UV light" or "UV radiation" refers to light having a wavelength in the range of 100-400 nm.

As used herein "visible light" or "visible radiation", for example the visible light emitted by a fluorescent composite, refers to light having a wavelength in the range of 400-700 nm.

As used herein "infrared light", "infrared radiation", "IR light" or "IR radiation" refers to light having a wavelength in the range of 700-10000 nm.

The terms "light" and "radiation" can be used interchangeably.

As used herein "when viewed under visible light" refers to, for example, viewing the compositions and/or stretchable electronics described herein through the human eye (e.g. unaided human eye) when the ambient light comprises mainly visible light, or essentially consists of visible light. For example, viewing under visible light may refer to viewing the compositions and/or stretchable electronics described herein in daylight or under an electric light (e.g. fluorescent lighting), therefore some UV light and/or IR light may be present. In some examples, viewing under visible light refers to viewing through the human eye when the ambient light comprises mainly visible light, for example in the substantial absence of UV light. For example, the intensity of any UV light present in the ambient light, and for example incident on the compositions and/or stretchable electronics described herein may be less than 0.05 mW/mm$^2$.

As used herein "stretchable" refers to the ability of a material, structure, device or device component to be strained without undergoing fracture such that it remains intact when stretched to a length greater than its original natural length. For example, a stretchable material, structure, device or device component may undergo strain larger than 0.5% without fracturing, for some applications strain larger than 1% without fracturing and for yet other applications strain larger than 3% without fracturing. Many stretchable structures are also flexible, such as PDMS. Some stretchable structures (e.g., device components) are engineered to be able to undergo compression, elongation and/or twisting so as to be able to deform without fracturing. Stretchable structures include thin film structures comprising stretchable materials, such as elastomers; bent structures capable of elongation, compression and/or twisting motion; and structures having an island and bridge geometry. Stretchable device components include structures having stretchable interconnects, such as stretchable electrical interconnects.

As used herein, the terms "flexible" and "bendable" refer to the ability of a material, structure, device or device component to be deformed into a curved or bent shape without undergoing a transformation that introduces significant strain, such as strain characterizing the failure point of a material, structure, device or device component, such that it remains intact during bending or folding. A flexible material, structure, device or device component may be deformed into a curved shape without introducing strain larger than or equal to 5%, for some applications larger than or equal to 1%, and for yet other applications larger than or equal to 0.5% in strain-sensitive regions. Some, but not necessarily all, flexible structures are also stretchable. For example, a thin film of copper may be flexible but not stretchable. A variety of properties provide flexible structures (e.g., device components) of the invention, including materials properties such as a low modulus, bending stiffness and flexural rigidity; physical dimensions such as small average thickness (e.g., less than 100 microns, optionally less than 10 microns and optionally less than 1 micron) and device geometries such as thin film and mesh geometries.

A flexible structure may comprise a curved conformation resulting from the application of a force. Flexible structures may have one or more folded regions, convex regions, concave regions, and any combinations thereof. For example, flexible structures may comprise a coiled conformation, a wrinkled conformation, a buckled conformation and/or a wavy (i.e., wave-shaped) configuration.

The stretchable electronic structure described herein may generally comprise a multilayer structure, including a structure wherein independently any of the substrate, liquid metal, and one or more layer(s) (and/or components of these) may be provided in a series of stacked layers, including layers and/or thin films that are provided in direct contact with each other in the series of layers or in a series having one or more intermediate layers (e.g., alloying layers, conducting layers, adhesive layers, contact layers, cover layers, spacer layers, etc.) provided between layers of the series. The positioning of each layer of the multilayer structure may be selected to provide enhanced electrical and/or mechanical attributes or device functionality. The stretchable electronic structure may comprise a biocompatible material or a bioinert material. The stretchable electronic structure may comprise one or more of the polymers and elastomers described herein. The stretchable electronic structure may comprise a thickness up to 100 cm, up to 10 cm, or up to 1 cm. The device may have a thickness of at least 1 micrometer, at least 5 micrometers, at least 10 micrometers, at least 100 micrometers. The device may have a thick from 1 micrometer to 1 meter, 5 micrometers to 10 cm. Each functional layer may be independently selected from a material and thickness sufficient to achieve its functionality in the multilayer structure.

The substrate may comprise a material having a surface that is capable of supporting a structure, including an electronic device or electronic device component. A structure that is "bonded" to the substrate refers to a portion of the structure in physical contact with the substrate and unable to substantially move relative to the substrate surface to which it is bonded. Unbonded portions, in contrast, may be capable of substantial movement relative to the substrate. The substrate may be planar, substantially planar, curved, have sharp edges, or any combination thereof.

The stretchable electronic structure described herein may comprise a cover layer to completely or partially encapsulate one or more other device components such as the liquid metal and/or substrate. The structure may be completely encapsulated by, and in physical contact with, the cover layer and/or substrate. For example, the cover layer and/or substrate may encapsulate at least 50% of the liquid metal, at least 90% of the liquid metal, or all of the liquid metal. The cover layer may partially or completely encapsulates the substrate. For example, the cover layer encapsulates at least 50% of the substrate, at least 90% of the substrate, or all of the substrate. The cover layer may effectively encapsulate the device from the surrounding environment. The cover layer may be periodically reapplied, such as daily, to facilitate long term use. A plurality of cover layers may be applied, including cover layers having different compositions for different functionality. For example, one cover layer may provide waterproofing and another durability. In this manner, the cover layer may be a composite cover layer to achieve better functional outcome. The cover layer may be functionally similar to the adhesive layer, contact layer, and/or spacer layers. For example, the cover layer may comprise an adhesive layer that binds to skin. In another example, the cover layer may comprise a spacer layer that separates one or more layers of the multilayer structure.

The stretchable electronic structure described herein may comprise a transfer substrate supporting the stretchable substrate, the liquid metal or both. Transfer substrates may facilitate administration of the device to a tissue site, for example, by providing net mechanical properties and/or physical dimensions of the device to allow effective handling, transfer and/or deployment to the tissue interface in a manner that does not damage or modify the properties of the other components of the device (e.g., substrate, liquid metal or other components). Transfer layers may also function as sacrificial layers that are at least partially removed upon administration to the tissue, for example, via dissolution or delamination (e.g., peel back) processes.

The transfer substrate may directly or indirectly contact the stretchable substrate. The transfer substrate may be bound to the stretchable substrate via one or more adhesive layers. The transfer substrate may comprise a removable substrate, wherein the transfer substrate is partially or completely removed after the device establishes conformal contact with the tissue. For example, the removable substrate may comprise a dissolvable substrate, wherein the removable substrate is partially or completely dissolved after the device is provided in contact with the tissue, for example via washing or rinsing with one or more solvents (e.g., water). The removable substrate may be configured to be separated from the stretchable substrate after administration, for example, via a delamination process.

The transfer substrate may comprises a bioinert or biocompatible material, for example, to minimize or avoid inflammation or unwanted immune responses upon administration of the device to a tissue in a biological environment. The transfer substrate may comprise a polymer layer having a thickness from 1 micrometer to 100 mm. The transfer substrate may have a composition and physical dimensions that allowed the device to be handled and/or administered by hand, for example, during a surgical procedure.

The device may be or comprise at least one portion that is at least partially transparent to electromagnetic radiation. The device may comprise a multilayer structure patterned to provide one or more transparent portions and one or more non-transparent portions. The transparent portions may transmit electromagnetic radiation in the ultraviolet, visible, and/or infrared regions of the electromagnetic spectrum having a preselected wavelength distribution. The non-transparent portions may substantially prevent transmission of electromagnetic radiation in the ultraviolet, visible, and/or infrared regions of the electromagnetic spectrum. The device may comprise portions that are at least partially transparent to electromagnetic radiation and portions which that opaque or block electromagnetic radiation. For example, portions of the device may be partially or fully transparent to electromagnetic radiation of a selected wavelength or over a selected region of the electromagnetic spectrum. For example, the selected wavelength may be 100-2000 nm, 1-2000 micrometers, 400-2000 nm, and the selected regions may be the UV, visible, IR, near IR, or microwave portions of the spectrum. At least one layer or portion of at least one layer of the multilayer structure may be selectively patterned to provide one or more transparent regions and one or more opaque regions.

The stretchable electronic devices described herein may comprise a controller in communication with a stretchable electronic circuit comprising the liquid metal. The controller may be useful to provide device control, signal processing, and/or measurement analysis functionality. The controller may receive input signals from the stretchable electronic circuit that serves the basis of closed-loop control of the electronic device, for example, providing real-time adjustment of sensing and actuation. The controller may provide closed-loop control of sensing and/or actuation based on signals received from the stretchable electronic circuit corresponding to measurements of one or more properties.

For example, the controller may be configured to provide an output signal to the stretchable electronic circuit, receive an input signal from the stretchable electronic circuit, or to provide an output signal to the stretchable electronic circuit and receive an input signal to the stretchable electronic circuit. As used herein, "in communication" refers to a configuration of devices or device components such that a signal may be exchanged, and includes one way communication and two way communication between the controller and the stretchable electronic circuit. The controller may be in electrical communication or wireless communication with the stretchable electronic circuit. The output signal may provide an input to the stretchable electronic circuit so as to control actuation or sensing. For example, the output signal may provide a sensing or actuation parameter from the controller to the stretchable electronic circuit, such as, a parameter relating to the timing of a measurement or actuation, the magnitude of a sensing or actuation variable (e.g., voltage, current, power, intensity, temperature, etc.). The input signal may provide a measurement parameter from the stretchable electronic circuit to the controller, such as a measurement parameter corresponding to a time, voltage, current, impedance, intensity, power, or temperature. The input signal may provide a measurement parameter corresponding to a plurality of voltage measurements, current measurements, electromagnetic radiation intensity or power measurements, temperature measurements, pressure measurements, acceleration measurements, movement measurements, chemical/physical concentration measurements, time measurements, position measurements, acoustic measurements or any combination of these. For example, the controller may receive and analyze the input signal from the stretchable electronic circuit and generate an output signal that controls or provides a sensing or actuation parameter(s) to the stretchable electronic circuit, for example via a closed-loop control algorithm that adjusts the sensing or actuation parameter(s) based on one or more measurements.

A wide range of controllers may be useful in the present devices and methods, including a microprocessor, microcontroller, digital signal processor, computer or fixed logic device. Controllers of this aspect include implantable controllers, controllers that are administered along with the stretchable electronic circuit and controllers that are ex vivo.

The stretchable electronic devices described herein may generally comprise devices such as integrated circuits, imagers or other optoelectronic devices. Electronic devices may also refer to a component of an electronic device such as passive or active components such as a semiconductor, interconnect, contact pad, transistors, diodes, LEDs, circuits, etc. Devices described herein may be useful in one or more of the following fields: collecting optics, diffusing optics, displays, pick and place assembly, vertical cavity surface-emitting lasers (VCSELS) and arrays thereof, LEDs and arrays thereof, transparent electronics, photovoltaic arrays, solar cells and arrays thereof, flexible electronics, micromanipulation, plastic electronics, displays, pick and place assembly, transfer printing, LEDs, transparent electronics, stretchable electronics, and flexible electronics.

This disclosure generally describes a visually imperceptible (when viewed under visible light) liquid metal-elastomer conductor using direct laser writing technique for transparent, stretchable electronics. The stretchable electronics described herein may be characterized by at least one of low sheet resistance ($R_{sO}$<3 Ω/sq), high transmittance (T>85%), and large extensibility (ε>100%) that are visually imperceptible when viewed under visible light. The transparent, stretchable electronics described herein may be useful for applications in "second skin" wearable computing, human-computer interaction, and soft robotics that depend on soft, elastic, and optically transparent functionality. In addition, such electronics may have sufficient stretchability to ensure conductivity over uneven and non-planar surfaces.

A stretchable and transparent electronic structure may generally comprise a stretchable elastomer layer; optionally, a metal adhesion layer on top of the stretchable elastomer layer; a metal alloying layer on top of the metal adhesion layer; and a liquid metal, wherein the structure is colorless and transparent when viewed under visible light. The structure may be optically clear, colorless, and/or transparent to the human eye. The structure may be characterized by at least 80% transmittance or from 80-100% transmittance from 400-800 nanometers, a sheet resistance less than 10 Ohm/square or from 0.01-10 Ohm/square, a volumetric resistivity less than $10^{-5}$ Ohm-meters or from $10^{-8}$ to $10^{-5}$ Ohm-meters, a Young's modulus up to 10 MPa or from 0.01-10 MPa, and a strain limit greater than 10% or from 10-1000%.

The structure may comprise, from 400-800 nanometers, a minimum transmittance of 80%, 85%, 90%, 92%, 95%, 98%, or 99%. The structure may comprise, from 400-800 nanometers, a maximum transmittance of 85%, 90%, 92%, 95%, 98%, 99%, or 100%. The structure may comprise a transmittance from 400-800 nanometers from 80-100%, 80-99%, 90-100%, 90-99%, 92-100%, 92-99%, 95-100%, 95-99%, 95-98%, or 98-99%.

The structure may comprise a minimum sheet resistance of 0.01, 0.05, 0.1, 0.5, 1, 2, 5, 8, or 9 Ohm/square. The structure may comprise a maximum sheet resistance of 0.05, 0.1, 0.5, 1, 2, 3, 4, 5, 6, 7, 8, 9 or 10 Ohm/square. The structure may comprise a sheet resistance 1-10 Ohm/square, 2-8 Ohm/square, 4-6 Ohm/square, 1-5 Ohm/square, 5-10 Ohm/square, 8-10 Ohm/square, 0.01-5 Ohm/square, 0.1-5 Ohm/square, or 0.01-1 Ohm/square.

The structure may comprise a minimum Young's modulus 0.01, 0.05, 0.1, 0.5, 1, 2, 5, 8, or 9 MPa. The structure may comprise a maximum Young's modulus 0.05, 0.1, 0.5, 1, 2, 3, 4, 5, 6, 7, 8, 9 or 10 MPa. The structure may comprise a Young's modulus 1-10 MPa, 2-8 MPa, 4-6 MPa, 1-5 MPa, 5-10 MPa, 8-10 MPa, 0.01-5 MPa, 0.1-5 MPa, or 0.01-1 MPa.

The structure may comprise a minimum strain limit of 10%, 25%, 50%, 75%, 80%, 85%, 90%, 100%, 250%, 500%, 750%, 850%, 900%, 950%, or 980%. The structure may comprise a maximum strain limit of 25%, 50%, 75%, 80%, 85%, 90%, 100%, 250%, 500%, 750%, 850%, 900%, 950%, 980%, or 1000%. The structure may comprise a strain limit of 10-500%, 250-750%, or 500-1000%.

The metal adhesion layer and metal alloying layer may each independently comprise platinum (Pt), copper (Cu), gold (Ag), lead (Pb), niobium (Nb), palladium (Pd), platinum (Pt), nickel (Ni), chromium (Cr), manganese (Mn), vanadium (V), tin (Sn), aluminum (Al), tantalum (Ta), iron (Fe), and combinations thereof. For example, the metal adhesion layer may comprise chromium and the metal alloying layer may comprise copper. The metal adhesion layer may comprise at least one of copper, gold, silver, aluminum, and tin. The metal adhesion layer may comprise silver nanoparticles, nanodots, or nanopowders, such as, an ink comprising metal nanoparticles, such as silver nanoparticles, for example.

The liquid metal may comprise any conductive metal material that is liquid at room temperature, such as 1-30° C., 15-25° C., 15-30° C., or 20-25° C. For example, the liquid metal comprises a conductive material that is liquid at a temperature from −20° C. to 40° C. The liquid metal may comprise one or more of a boiling point greater than 1300° C., a melting point less than 0° C., less than −5° C., less than −10° C., or less than −15° C., a vapor pressure less than $10^{-8}$ Torr (at 500° C.), a density of 6.44 g/cm$^3$ (at 20° C.), insoluble in water or organic solvents, a viscosity of 0.0024 Pa·s (at 20° C.), a thermal conductivity of 16.5 W·m$^{-1}$·K$^{-1}$, an electrical conductivity of 3.46×106 S/m (at 20° C.), a surface tension of 0.535-0.718 N/m (at 20° C.), and a specific heat capacity of 296 J·kg$^{-1}$·K$^{-1}$. The liquid metal may comprise indium (In), silicon (Si), tin (Sn), germanium (Ge), bismuth (Bi), zinc (Zn), tellurium (Te), lead (Pb), gallium (Ga), aluminum (Al), arsenic (As), lithium (Li), or combinations thereof. For example, the liquid metal may comprise a metal alloy comprising gallium and copper. The liquid metal may comprise EGaIn and/or Galistan (68.5% Ga, 21.5% In, and 10% Sn, by weight). The liquid metal may be a metal alloy consisting essentially of gallium, indium, and copper and, optionally, tin.

The structure may comprise a biphasic metal coating. The biphasic metal coating may comprise the liquid metal, metal adhesion layer, and/or metal alloying layer. The biphasic metal coating may comprise the liquid metal, chromium, and copper. The biphasic metal coating may comprise EGaIn, chromium, and copper.

The stretchable elastomer layer may comprise an elastomer that is colorless and transparent when viewed under visible light. "Elastomer" refers to a polymeric material which can be stretched or deformed and return to its original shape without substantial permanent deformation. Elastomers may undergo substantially elastic deformations. Useful elastomers include those comprising polymers, copolymers, composite materials or mixtures of polymers and copolymers. Elastomeric layer refers to a layer comprising at least one elastomer. Elastomeric layers may also include dopants and other non-elastomeric materials. The elastomer may comprise thermoplastic elastomers, styrenic materials, olefenic materials, polyamides, polyimides, polyvinylchlorides, polyolefins, polyethylenes, polypropylenes, polybutylenes, ethylene-propylene copolymers, polyisobutyrates, polystyrenes, acrylonitrile-butadiene-styrene resins, polycarbonates, poly acrylic and methacrylic acid resins, polyethylene terephthalates, polyurethanes, epoxy resins, silicone resins, polyester resins, alkyd resins, acrylonitrile polymers, polyesteramides, ethylene-vinyl acetate copolymers, natural rubber (e.g., latex), synthetic rubbers, polyisoprene (e.g., natural or synthetic), and block copolymer elastomers, such as styrene-ethylene-butylene-styrene elastomer (SEBS) and combinations thereof. The elastomer may comprise silicones (e.g., polydimethylsiloxane; soft urethanes (e.g., polyurethane elastomer); acrylate polymers (e.g., acrylic elastomers); and/or fluoropolymers (e.g., perfluoroelastomer). The stretchable elastomer layer may comprise one of a stretchable silicon layer and a stretchable fluoropolymer layer. For example, the stretchable elastomer layer may comprise one of polydimethylsiloxane and polytetrafluoroethylene.

As generally used herein, "polymer" refers to a macromolecule composed of repeating structural units connected by covalent chemical bonds or the polymerization product of one or more monomers, often characterized by a high molecular weight. The term polymer includes homopolymers, or polymers consisting essentially of a single repeating monomer subunit. The term polymer also includes copolymers, or polymers consisting essentially of two or more monomer subunits, such as random, block, alternating, segmented, graft, tapered and other copolymers. Useful polymers include organic polymers or inorganic polymers and may be in amorphous, semi-amorphous, crystalline or partially crystalline states. Cross linked polymers having linked monomer chains are particularly useful for some applications. Polymers useable in the methods, devices and device components include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulfone based resins, vinyl-based resins, rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin or any combinations of these.

The biphasic metal coating may comprise conductive grid lines on less than 25% of total surface area of the top surface of the stretchable elastomer layer. For example, the conductive grid lines may comprise less than 20%, less than 15%, less than 10%, less than 5%, 5-15%, 1-10%, or 10-15% of total surface area of the top surface of the stretchable elastomer layer. Without wishing to be bound to any particular theory, it is believe that traces that are sufficiently narrow but are spaced too close together (such that the area fraction at least 25%, at least 20%, at least 15%, or at least 10% of total surface area of the top of the stretchable elastomer layer) may reduce and/or prevent transparency of the structure.

The structure may comprise a plurality of laser patterned biphasic metallic grid lines having a thickness up to 1000 nanometers, from 1-1000 nanometers, or up to 600 nanometers, and a width up to 10 micrometers, 0.1-10 micrometers, or up to 6 micrometers. Without wishing to be bound to any particular theory, it is believed that traces that are too wide (greater than 10 microns) may be visible to the eye, even if the area fraction is small, and if the area fraction is too small and the traces are too narrow (e.g., 0.1% area fraction with 100 nm wide traces), then the structure may not be sufficiently conductive.

The shapes and dimensions of the stretchable electronic structures may vary depending upon the desired application. For example, the stretchable electronic structures may be manufactured in a bar shape, a u shape, or an m shape. The stretchable electronic structures may be connected in any pattern, depending upon the desired application.

A method of manufacturing a stretchable and transparent electronic structure may generally comprise laser patterning an electrically conductive material layer on a stretchable substrate to form a plurality of void spaces therein, wherein the electrically conductive material layer comprises biphasic metallic grid lines having a thickness up to 600 nanometers and a width up to 6 micrometers, wherein the structure comprises, based on the structure's total top surface area, up to 15% of the electrically conductive material layer and at least 85% void spaces, and wherein the structure is colorless and transparent when viewed under visible light. The structure may comprise at least 80% transmittance from 400-800 nanometers, a sheet resistance less than 10 Ohm/square, a volumetric resistivity less than $10^{-5}$ Ohm-meters, a Young's modulus from 0.01-10 MPa, and a strain limit less than 50%; and wherein the structure is invisible to the human eye when viewed in the substantial absence of UV light.

The laser patterning may comprise laser etching, laser ablation, electron beam machining or etching, ion beam milling or etching, roll forming, embossing, lithography, and combinations thereof. A laser having a suitable wavelength may be directed at the biphasic metal coating (i.e., the electrically conductive material layer) to directly remove the biphasic metal coating from the stretchable elastomer layer to generate the voids. The wavelength may comprise one of 355 nm and 1064 nm. The laser may comprise a power output of from 0.01-100 Watt or 0.1-10 Watt; a pulse duration from 1 femtosecond to 1 microsecond, or 5 picoseconds to 10 nanoseconds; a scan speed from 1 micrometer/second to 10 m/s, or 100 micrometers/second to 1 m/s; and a working distance from 1 micrometer to 1 meter, 100 micrometers to 1 meter, 100 micrometers to 10 cm, or 500 micrometers to 30 cm. For example, the laser patterning may comprise a speed of greater than or equal to 0.1 meter/second.

The laser patterning may comprise directing a laser at the electrically conductive material layer to form a pattern of the plurality of void spaces by laser etching or laser ablation. The laser patterning may comprise directing a first laser at the electrically conductive material layer to form a first pattern of the plurality of void spaces having a width greater than 10 micrometers by laser etching or laser ablation. The laser patterning may comprise directing a second laser at the electrically conductive material layer to form a second pattern of the plurality of void spaces having a width less than 10 micrometers by laser etching or laser ablation. The first laser and second laser may have the same wavelength or different wavelengths. For example, the first laser may comprise a wavelength of 355 nanometers, a power of 0.7 microjoules, a frequency of 500 kHz, a pulse duration of 10 nanoseconds, a spot size of 15 micrometers, and a scan speed of 50 mm/second, and a working distance of 103 millimeters, and the second laser may comprise a wavelength of 1064 nanometers, a power of 0.5 microjoules, a frequency of 500 kHz, a pulse duration of 12 picoseconds, a spot size of 8 micrometers, and a scan speed of 50 mm/second, and a working distance of 25 millimeters.

The laser patterning may comprise a repeating pattern of closed geometry gridlines. As the patterning processes may be linear processes, predetermined linear void space patterns may be generated in the electrically conductive material layer via computer-controlled programming. The electrically conductive material layer may comprise a relatively dense pattern of repeating polygons (e.g., squares) formed by linear scans of the laser. The plurality of void spaces may occupy an area of greater than or equal to 15% by area of an area of the electrically conductive material layer.

As used in this context, the term "patterned" refers to selective variation of the physical properties, chemical composition, physical dimensions and/or geometry of a device or component thereof, for example via openings, channels, pores, contact regions, permeable regions, impermeable regions, transmissive regions, conductive regions and/or opaque regions. In an embodiment, the barrier layer is patterned to have one or more contact regions, such as openings or passages allowing physical contact between components of the electronic circuit (e.g., electrodes or sensors) and the tissue. In an embodiment, the barrier layer is patterned to have one or more transmissive regions, such as windows allowing optical communication between components (e.g., sensors, optical sources, LEDs, laser, photodiodes, etc.) of the electronic circuit and the tissue. In an embodiment, the barrier layer is patterned to have one or more chemically permeable regions, such as pores or channels allowing selective transport of target molecules between with electronic circuit and the tissue. Patterned in this context may refer to a device component, such as a barrier layer, that is patterned via a microprocessing technique such as optical lithography, soft lithography, etching, e-beam writing and/or laser ablation.

The method may comprise depositing a metal adhesion layer on a stretchable substrate; depositing a metal alloying layer on the metal adhesion layer; and alloying a liquid metal and the metal alloying layer to form the electrically conductive material layer; and ablating a pattern of the electrically conductive material layer to form the biphasic metallic grid lines. Depositing the metal adhesion layer and/or metal alloying layer may be independently selected from physical vapor deposition, chemical vapor deposition, sputtering, atomic layer deposition, electrochemical deposition, spin coating, dip coating, ink jet printing and any combination thereof.

Design of Visually Imperceptible LM Circuitry

The human eye has the minimum angular resolution ($\varnothing_{Th}$) of around 0.29 mrad (see C. A. Curcio, K. R. Sloan, R. E. Kalina, A. E. Hendrickson, *J. Comp. Neurol.* 1990, 292, 497) and an average ideal reading distance (D) of around 25-35 cm (FIG. 5). See R. L. Levien, presented at *Electronic Imaging* 2004, California, 12, 2003. The grating acuity threshold ($G_{Th}$), for the minimum grating pitch that may be distinguished by human eyes, may be expressed as $$G_{Th} = D \cdot \varnothing_{Th}$$

yielding the range from 72.5-101.5 μm. Referring to FIG. 1, a grating pitch (p) of less than $G_{Th}$ may thus be unresolved and appear as a uniform intensity to human eyes. For the objective of visually imperceptible at ideal reading distance, such as touch-display computing, the liquid metal pitch may be set from 10 micrometers to 1 mm.

Figure 2:
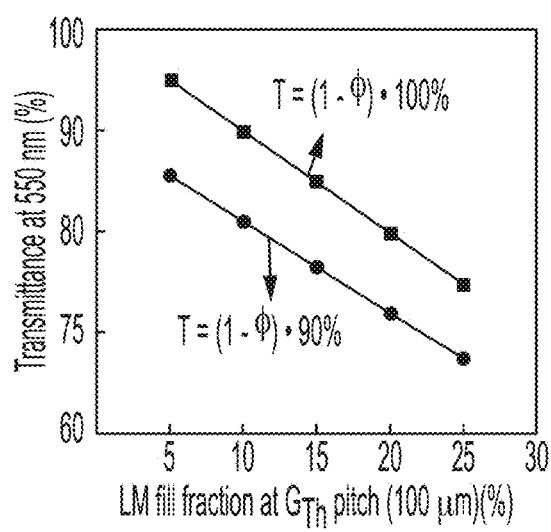
FIG. 2 illustrates transmittance through a grated line pattern at 550 nm wavelength at different liquid metal trace width and 100 µm line pitch corresponding to grating acuity threshold of the human eye using two different transmittance values of the polydimethylsiloxane (PDMS) film ($T_{PDMS}$).

The stretchable electronics described herein may be characterized by high optical transmittance. Following the relative transmittance of the patterned film $T=(1-\phi)\cdot T_{PDMS}$ on the liquid metal filling fraction, $\phi$. FIG. 2 shows the transmittance calculated for a defect-free PDMS substrate (blue line: $T_{PDMS}=100\%$) as a function of increasing gridline (trace) width. Without wishing to be bound to any particular theory, the stretchable electronics may comprise a high overall 90% transmittance of a circuit patterned with a combination 10 µm wide liquid metal traces at 100 µm pitch assuming an ideal transparent substrate of $T_{PDMS}=100\%$. However, defects in the PDMS substrate may reduce the reference transmission to $T_{PDMS}$ about 89%, which may reduce the liquid metal traces to a width of less than 5.6 µm to achieve 85% transmittance. Such narrow trace widths may further reduce the grating contrast and make circuits visually imperceptible under both high contrast (front-lit) and low-contrast (back-lit) conditions at normal reading distances.

Conventional flexible electronics having less than 10 µm wide liquid metal traces may be challenging to manufacture. This disclosure describes direct writing via picosecond laser processing of a thin film of liquid metal to provide narrow (about 4.5 µm) wide lines with a 96 µm pitch (i.e. center-to-center spacing) such that the stretchable electronics described herein may comprise a visually imperceptible grating pattern or traces of liquid metal with 85.4% optical transmittance. A width of less than 20 µm width may be used when mounting grating structures on or near the lens surface, which may cast a diverging/blurry shadow that is not resolved on the retina. Thus, for contact lens applications, 20 µm line patterns having a 500 µm period ($\phi=4\%$) may be used for achieving a combination of high optically transparency (T>85%) and electrical functionality.

Stress-Strain Curves of Unpatterned PDMS

Figure 3:
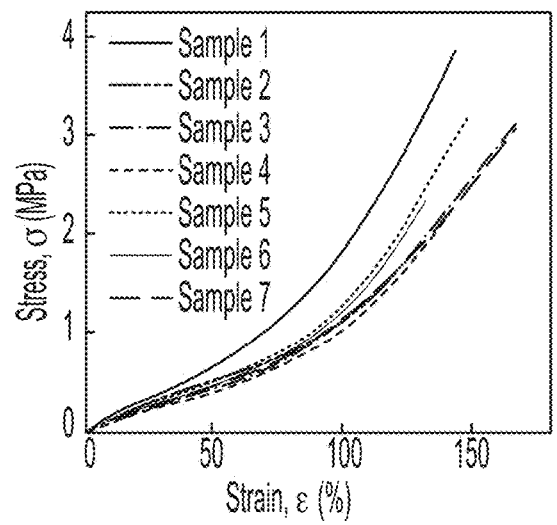
FIG. 3 illustrates mechanical stress-strain data of 150 µm thick PDMS film.

Referring to FIG. 3, the stress-strain response of seven 150 µm-thick PDMS films (without laser ablation and metal coating) show that the strain limit of PDMS spans a wide range from 131%-170%. This tensile testing was conducted by a universal mechanical testing machine (Instron 5969) under the tensile rate of 10 mm/min until the applied force dropped by 50%.

Figure 4A:
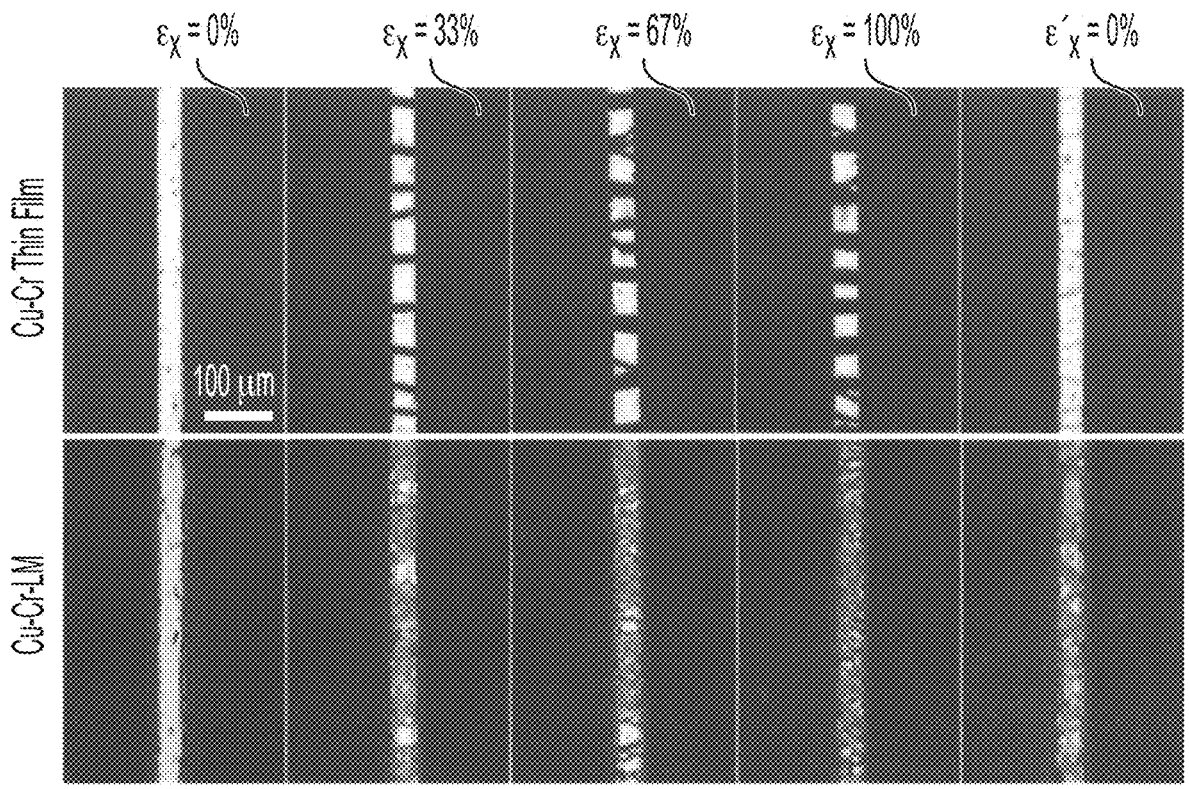
FIGS. 4A-B illustrate optical images of laser patterned copper-chromium thin-films and biphasic metallic grids comprising liquid metal/copper/chromium architecture at different strains in (FIG. 4A) longitudinal (FIG. 4B) transverse direction that are relaxed ($\varepsilon'=0\%$) after being progressively stretched to the maximum strain $\varepsilon=100\%$.
Figure 4B:
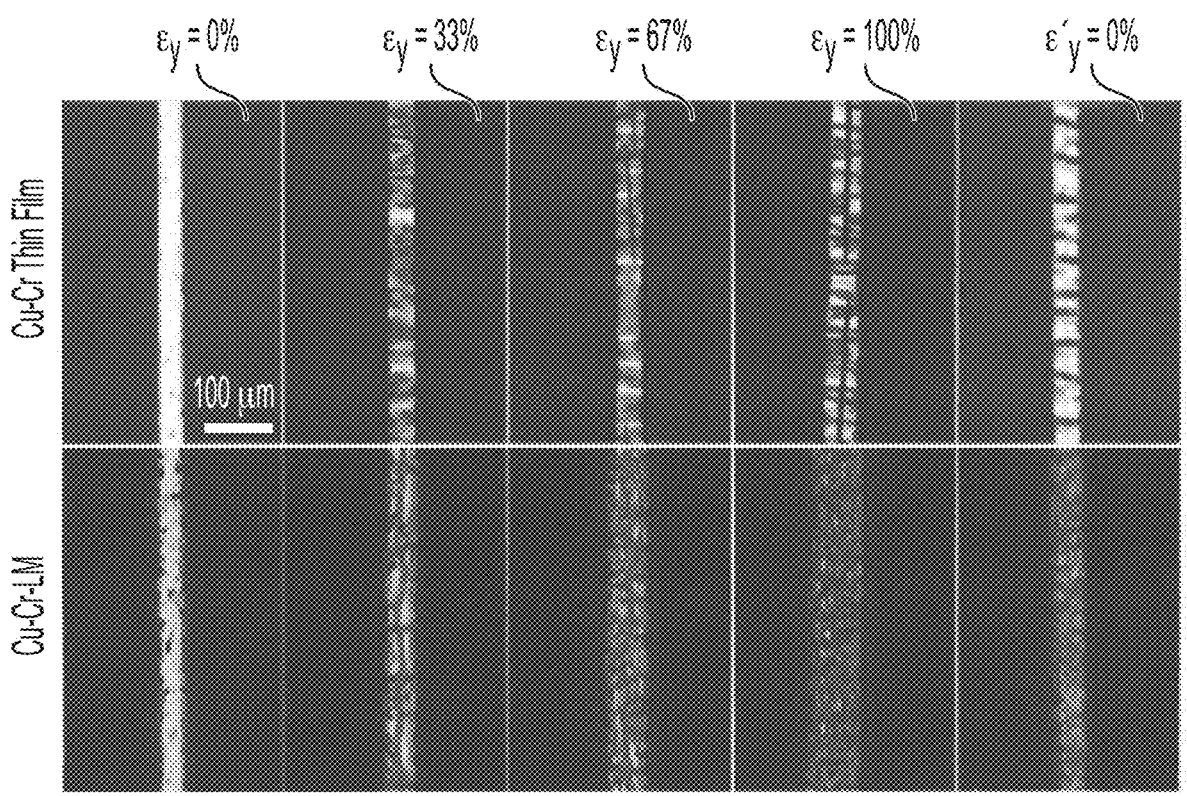

Cyclic Mechanical Response of Laser-Patterned Cu—Cr Thin-Film and Biphasic Metallic Grids (LM-Cu—Cr) Under Longitudinal and Transverse Loading FIGS. 4A and 4B shows mechanical deformation in laser-patterned copper/chromium thin film and liquid metal/copper/chromium conductive grids on PDMS surfaces at different tensile strains applied in longitudinal (FIG. 4A) and transverse (FIG. 4B) directions. In both loading directions, mechanical strain was first gradually ramped from $\varepsilon=0\%$ (original relaxed state) to 100% and then released to relax the sample ($\varepsilon'=0$). The longitudinal elongation may lead to the formation of narrow parallel cracks in copper/chromium thin film that may widen with increased strain. In the case of laser patterned liquid metal conductors, the cracks in the copper/chromium underlayer may be filled with liquid metal, leading to the ragged morphology of liquid metal traces. Upon relaxation ($\varepsilon_x'=0$), the cracks may shrink back to form microchannels with no or little evidence of film delamination. In the case of transverse loading, periodic wrinkling of thin-films was observed at lower strains, which was accompanied by long cracks in the longitudinal direction at higher strains (at least 67%). Permanent wrinkling and increased line width were observed in both copper/chromium thin film and biphasic metallic grids after releasing the strain ($\varepsilon_y'=0$) when compared with the original relaxed state ($\varepsilon_y=0$).

$T_{PDMS}$ Measurement and PDMS Surface Quality

The optical transmittance of the laser-patterned liquid metal-elastomer conductor (7) was measured with respect to a bare PDMS surface and theoretically calculated with the ideal geometric open surface area using the following equation:

$$T = \frac{I_i \cdot (1-\phi) \cdot T_{PDMS}}{I_i} = (1-\phi) \cdot T_{PDMS} \cdot (1)$$

Figure 5A:
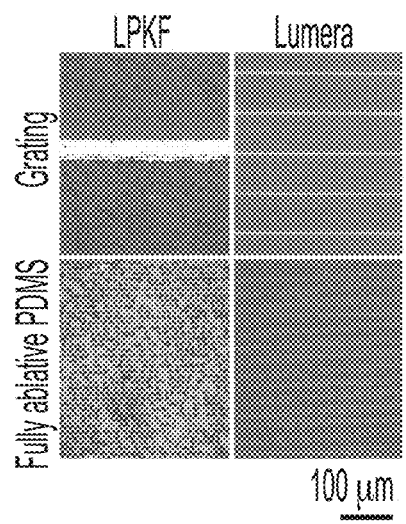
FIG. 5A illustrates microscope images of grated pattern fabricated with LPKF and Lumera laser systems and PDMS surface after completely removing metal layers on PDMS surface by identical processing parameters.
Figure 5B:
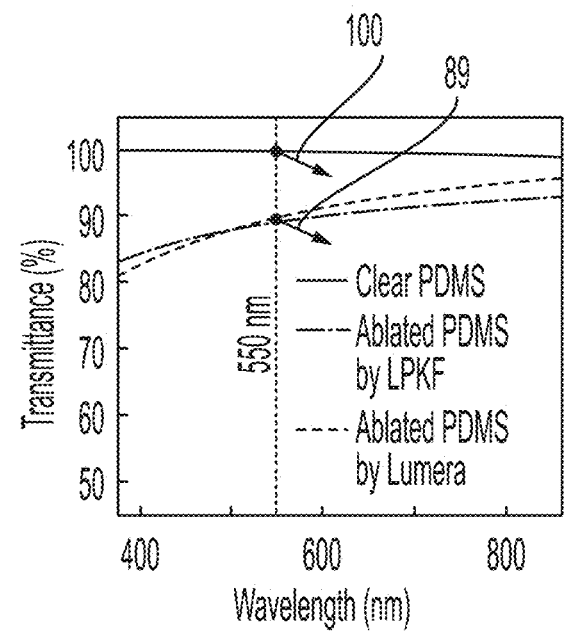
FIG. 5B illustrates transmittance spectra of completely ablated PDMS surface by LPKF and Lumera laser systems, and clear PDMS lacking any material deposited on its surface.

Here, $T_{PDMS}$ is the transmittance of laser processed PDMS substrate, and $\phi$ is the liquid metal filling fraction defined as areal ratio of EGaIn lines to the whole pattern area. Images of laser patterned surfaces with and without gratings are shown in FIGS. 5A and 5B. Diffraction angles for 100 µm period (angle=0.33° at 550 nm) gratings may be small and may be discounted as a significant loss factor.

Figure 6A:
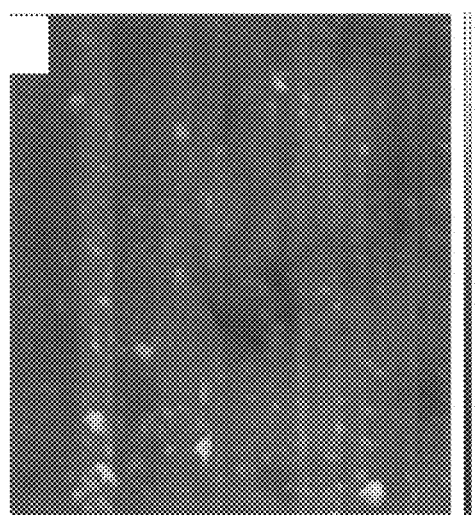
FIGS. 6A-B illustrate the surface topography maps of laser exposed 35 µm×35 µm PDMS surface in samples processed by LPKF (FIG. 6A) and Lumera (FIG. 6B) laser systems.
Figure 6B:
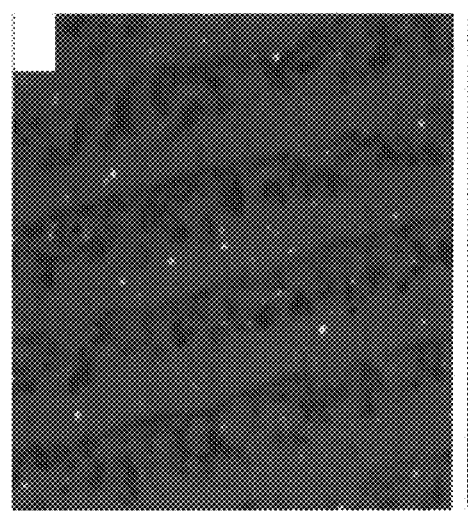

The transmittance of the bare PDMS is shown in FIG. 5B for the following three cases: (i) "pristine PDMS" that is not coated or ablated and (ii, iii) PDMS from which the metal film is fully ablated with either LPKF or Lumera laser systems. For the latter case, measurements are performed on samples prepared by completely ablating an 18 cm×15 cm area of metal thin films from PDMS surface using the same laser processing parameters as the grated samples. The surface topography maps of laser exposed PDMS surface obtained by atomic force microscopy are presented in FIGS. 6A and 6B. The measured root mean square roughness (RMS) of 35 µm×35 µm PDMS surface area processed by LPKF (FIG. 6A) and Lumera (FIG. 6B) laser systems is about 230 nm and about 62 nm, respectively.

Without wishing to be bound to any particular theory, it is believed that the transmittances using LPKF and Lumera laser systems are approximated about 89% (89.2 and 88.76%, respectively) notwithstanding the difference in surface morphology.

Figure 7A:
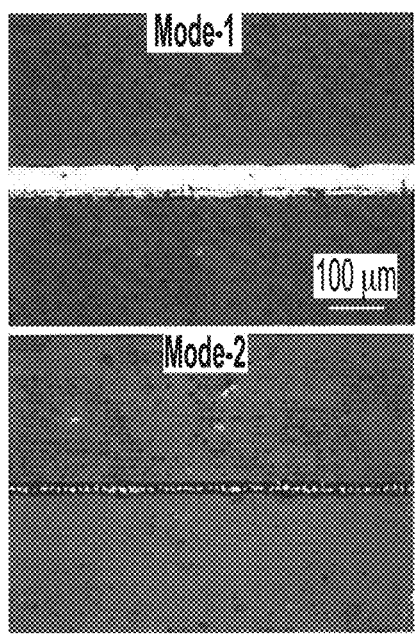
FIG. 7A illustrates scanning electron micrographs of laser patterned liquid metal grids on PDMS surface using the LPKF laser system in continuous scanning mode (Mode 1)
Figure 7B:
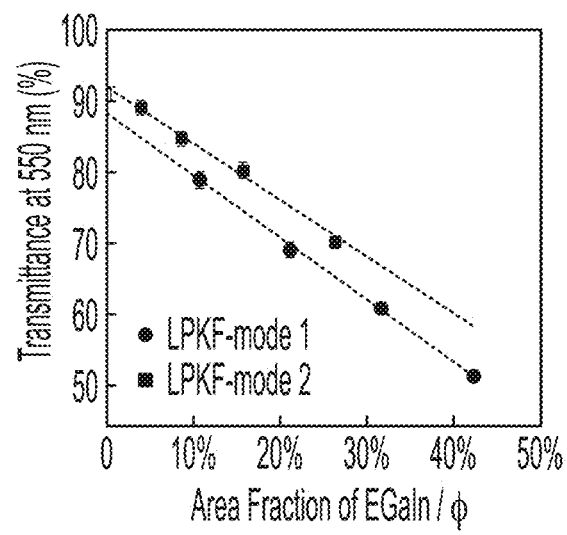
FIG. 7B illustrates better PDMS surface quality, hence, higher transmittance at the same fill fraction, using the LPKF laser system in random scanning mode (Mode 2).

The transmittance of the stretchable electronics may be improved (T>90% at 550 nm) by custom-designing the laser scan path and optimizing the overlap between the adjacent scans of the laser-patterned liquid metal conductors. FIG. 7A shows scanning electron micrographs (SEM) of liquid metal conductors patterned with the same laser processing parameters using two different processing modes of the LPKF laser system. In Mode 1, the laser scans the liquid metal conductor continuously from one longitudinal edge to another longitudinal edge whereas in Mode 2, the laser randomly scans the liquid metal conductor in a longitudinal direction to remove the conductive thin-film. In comparison with continuous scanning in Mode 1, Mode 2 may produce a cleaner exposed PDMS surface having less thermal damage, which may achieve liquid metal conductors having higher transmittance at the same liquid metal filling fraction (see FIG. 7B). Without wishing to be bound to any particular theory, it is believed that this may be due to different overlap between adjacent scans and/or reduction in local accumulation of heat due to time delay between the adjacent scans during the random scanning mode.

Optomechanical Performance of Laser Processed Bare PDMS Substrate

Figure 8B:
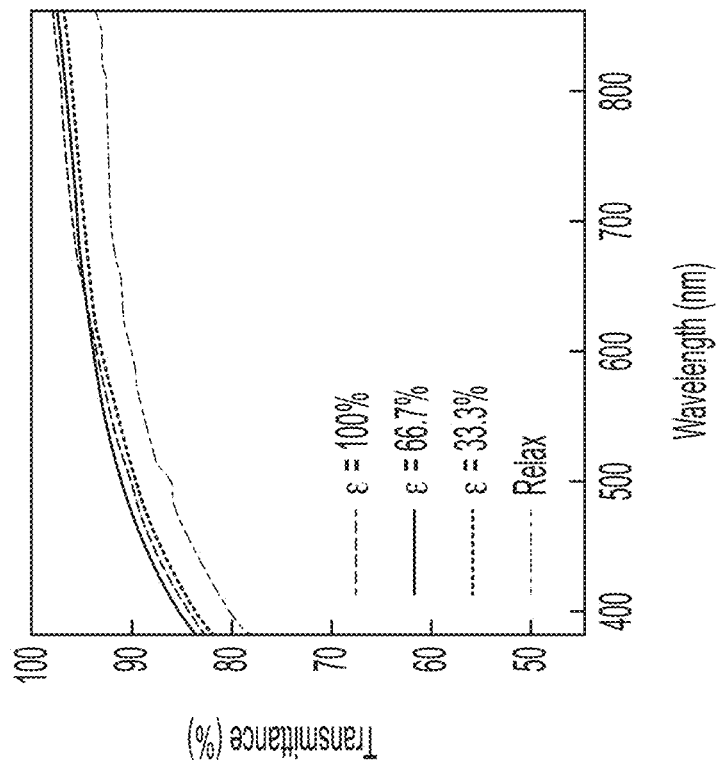
FIG. 8B illustrates transmittance response of the laser processed bare PDMS substrate over the full visible wavelength range when stretched to different strain values.
Figure 8A:
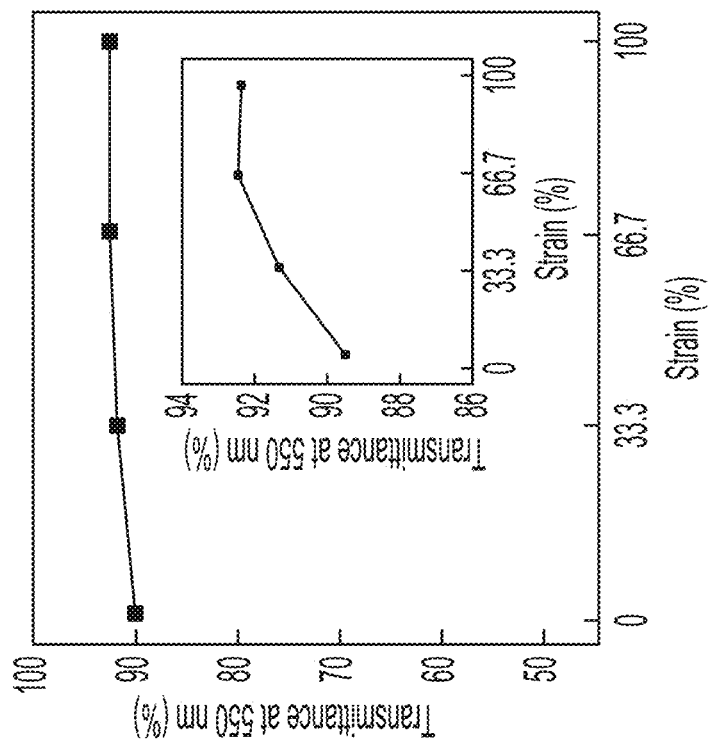
FIG. 8A illustrates transmittance at 550 nm wavelength through a laser processed bare PDMS substrate as a function of applied strain.

FIGS. 8A and 8B show plots of the transmittance of 550 nm wavelength and full visible spectrum, respectively, through the laser processed PDMS substrate as a function of longitudinal strain. The slight increase in transmittance may be attributed to semitransparent defects of the laser ablated PDMS (the black dots in FIG. 4A). Without wishing to be bound to any particular theory, it is believed that these defect features may deform to submicron sizes under the applied strain and cause diffraction of visible light. The increase in transmittance through the ablated PDMS surface may be similar to grated samples shown in FIGS. 13C and 13D.

Laser Ablation of Biphasic Metallic Thin-Film on PDMS Substrate

Figure 9A:
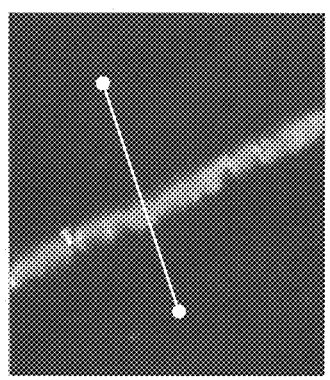
FIG. 9A illustrates an image of a liquid metal conductor with the cross-section profile of patterned liquid metal trace on PDMS surface.
Figure 9B:
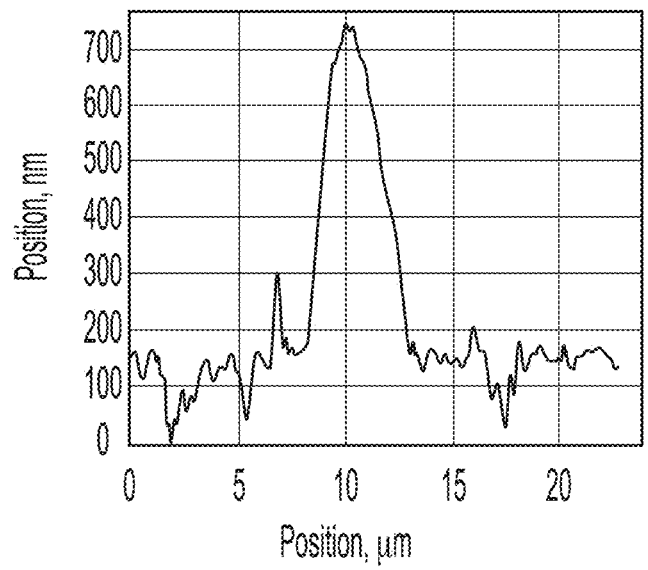
FIG. 9B illustrates an atomic force micrograph of the liquid metal conductor of FIG. 9A.

FIG. 9B shows an atomic force micrograph and FIG. 9A shows a section profile of a liquid metal conductor comprising a 4.5 µm wide liquid metal trace on a PDMS surface. The combined thickness t is about 600 nm. Since the 120 nm of copper/chromium film may be deposited, the liquid metal coating may have a thickness of about 480 nm. Therefore, a sample with a sheet resistance $R_s = \rho/t$ of 1.7 Ω/sq may have an effective volumetric resistivity of $\rho = 1.02 \times 10^{-6}$ Ωm. The measured resistivity of the same liquid metal grid pattern on the PDMS substrate without the copper/chromium adhesive thin film may be $2.9 \times 10^{-6}$ Ω·m. Likewise, for a patterned copper/chromium film without liquid metal film, the resistivity may be $4.1 \times 10^{-7}$ Ω·m. That the total resistivity ($1.02 \times 10^{-6}$ Ω·m) may be below the weighted sum of the two layers may suggest that an alloy is formed between the metals (e.g. an indium/chromium alloy) that may have higher conductivity than EGaIn. Without wishing to be bound to any particular theory, it is believed that the thermal ablative laser process does not materially degrade the electrical properties of the liquid metal.

Figure 10A:
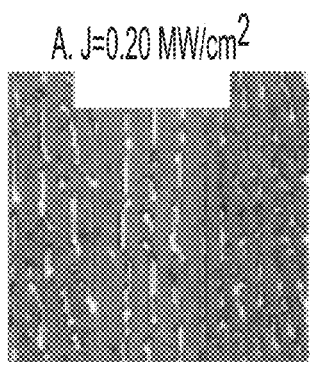
FIGS. 10A-C illustrate high-resolution optical images of samples patterned with different laser power densities that are fabricated with LPKF laser system.
Figure 10B:
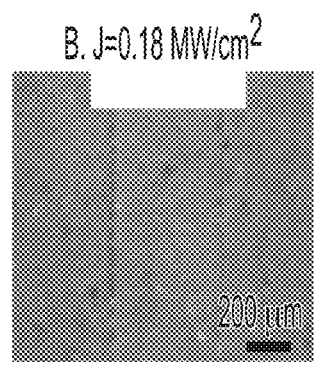
Figure 10C:
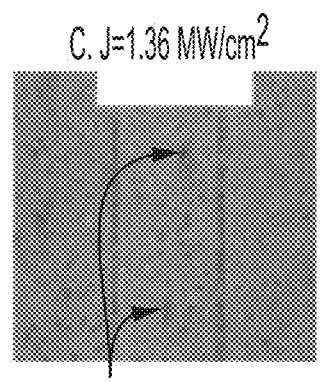

FIGS. 10A-C show optical images of liquid metal conductors patterned with different LPKF laser exposures in the ablation step. At the threshold power density $J=0.28$ MW/cm$^2$, the biphasic metallic thin-film (liquid metal/copper/chromium) may be completely removed from the PDMS substrate to provide well defined liquid metal straight line grid pattern having minimum thermal damage to the exposed PDMS substrate between the lines (FIG. 10B). Below this threshold exposure, biphasic metallic film may not be completely removed from the PDMS substrate (FIG. 10A). The ablative removal of biphasic thin-film at comparatively higher power densities (FIG. 10C) may result in higher thermal damage to PDMS substrate.

This disclosure generally describes materials architecture and laser-based microfabrication techniques to produce electrically conductive films (e.g., having a sheet resistance=2.95 Ω/sq and a resistivity=$1.77 \times 10^{-6}$ Ω·m) that may be soft, elastic (strain limit greater than 100%), and/or optically transparent. The films may comprise a grid-like array of visually imperceptible liquid metal (LM) lines on a clear elastomer. Unlike conventional transparent LM circuitry, the films described herein may allow for fully imperceptible electronics that have not only high optical transmittance (greater than 85% at 550 nm) but may be also invisible under typical lighting conditions and reading distances to the human eye. This unique combination of properties may be provided by using a laser writing technique that results in LM grid patterns having a line width and pitch as small as 4.5 µm and 100 µm, respectively, which may produce grid-like wiring that has adequate conductivity for digital functionality but may be also well below the threshold for visual perception. The films may be characterized by electrical, mechanical, electromechanical, and optomechanical properties and high conductivity and transparency that are preserved at tensile strains of about 100%. To demonstrate their effectiveness for emerging applications in transparent displays and sensing electronics, the materials architecture may be incorporated into applications related to chemical hazard warning.

Transparent conductors like indium-tin-oxide (ITO), Gallium-doped Zinc Oxide (GZO) (see A. Abduev, A. Akmedov, A. Asvarov, A. Chiolerio, *Plasma Processes. Polym.* 2015, 12, 725), and PEDOT:PSS have played a central role in the development of touch-display computing (see M. S. Kim, C. H. Jeong, J. T. Lim, G. Y. Yeom, *Thin Solid Films.* 2008, 516, 3590; J. Lewis, *Mater. Today.* 2006, 9, 38; P. Görrn, M. Sander, J. Meyer, M. Kröger, E. Becker, H. H. Johannes, W. Kowalsky, T. Riedl, *Adv. Mater.* 2006, 18, 738), wearable devices (see S. Savagatrup, E. Chan, S. M. Renteria-Garcia, A. D. Printz, A. V. Zaretski, T. F. O'Connor, D. Rodriquez, E. Valle, D. J. Lipomi, *Adv. Funct. Mater.* 2015, 25, 427; M. Stoppa, A. Chiolerio, Sensors. 2014, 14, 11957), photovoltaics (see N. R. Armstrong, P. A. Veneman, E. Ratcliff, D. Placencia, M. Brumbach, *Acc. Chem. Res.* 2009, 42, 1748; Y. S. Park, K. H. Choi, H. K. Kim, *J. Phys. D: Appl. Phys.* 2009, 42, 235109), and other flexible and optoelectronic thin-film technologies that require robust electronic interfaces with high optical transmittance. However, the successful integration of these devices into future "soft-matter" technologies for wearable computing (see C. C. Kim, H. H. Lee, K. H. Oh, J. Y. Sun, *Science* 2016, 353, 682; C. Keplinger, J. Y. Sun, C. C. Foo, P. Rothemund, G. M. Whitesides, Z. Suo, *Science* 2013, 341, 984), human-machine interfaces (see J. J. Liang, L. Li, X. F. Niu, Z. B. Yu, Q. B. Pei, *Nat. Photonics* 2013, 7, 817; T. Sekitani, H. Nakajima, H. Maeda, T. Fukushima, T. Aida, K. Hata, T. Someya, *Nat. Mater.* 2009, 8, 494), bionic contacts (see A. Vasquez Quintero, R. Verplancke, H. De Smet, J. Vanfleteren, *Adv. Mater. Technol.* 2017, 2, 1700073), or direct interfacing of living neurons with resistive switching devices (see T. Stieglitz, W. Huang, S. C. Chen, J. W. Morley, N. H. Lovell, G. J. Suaning, presented at 2010 *Annual International Conference of the IEEE Engineering in Medicine and Biology*, Buenos Aires, 8, 2010), may benefit from a new generation of "optically-clear" conductors that are primarily engineered from materials that match the mechanical properties of soft biological tissues. Efforts in this domain have been largely focused on two discrete domains: synthetic composite materials (e.g. elastomers with conductive nanoparticle filler) and deterministic multimaterial architectures (patterned metal films on an elastomer substrate) formed by combining high-performance conducting materials with stretchable polymers. The first class includes a variety of stretchable conductive materials that have been developed by loading clear elastic polymers and gels with visually imperceptible particulates such as carbon nanotubes and graphene (see D. J. Lipomi, M. Vosgueritchian, B. C. K. Tee, S. L. Hellstrom, J. A. Lee, C. H. Fox, Z. Bao, *Nat. Nanotechnol.* 2011, 6, 788; Z. B. Yu, X. F. Niu, Z. T. Liu, Q. B. Pei, *Adv. Mater.* 2011, 23, 3989; K. H. Kim, M. Vural, M. F. Islam, *Adv. Mater.* 2011, 23, 2865; K. S. Kim, Y. Zhao, H. Jang, S. Y. Lee, J. M. Kim, K. S. Kim, J.-H. Ahn, P. Kim, J. Y. Choi, B. H. Hong, *Nature* 2009, 457, 706), metal nanowires (see W. L. Hu, X. F. Niu, L. Li, S. Y. Yun, Z. B. Yu, Q. B. Pei, *Nanotechnology* 2012, 23, 344002; W. L. Hu, R. R. Wang, Y. F. Lu, Q. B. Pei, *J. Mater. Chem. C* 2014, 2, 1298), or metal salt (see C. Keplinger, J. Y. Sun, C. C. Foo, P. Rothemund, G. M. Whitesides, Z. Suo, *Science* 2013, 341, 984). While these composite materials may show promising stretchability (e.g, elastic strain limit, $\varepsilon_{max} > 100\%$), low sheet resistance (e.g., $R_s < 10$ Ω/sq) and optical transparency (e.g., T about 70-98%), they may exhibit significant electromechanical and optomechanical coupling and/or hysteresis (see D. McCoul, W. L. Hu, M. M. Gao, V. Mehta, Q. B. Pei, *Adv. Electron. Mater.* 2016, 2, 1500407; H. Wu, L. Hu, M. W. Rowell, D. Kong, J. J. Cha, J. R. McDonough, J. Zhu, Y. Yang, M. D. McGehee, Y. Cui, *Nano Lett.* 2010, 10, 4242). The second class of "deterministic" transparent conductors may comprise lithographically-patterned meshes of gold or copper on a soft polymer substrate (see H. Wu, D. Kong, Z. Ruan, P. C. Hsu, S. Wang, Z. Yu, T. J. Carney, L. Hu, S. Fan, Y. Cui, *Nat. Nanotechnol.* 2013, 8, 421; C. F. Guo, T. Sun, Q. Liu, Z. Suo, Z. Ren, Nat. Commun. 2014, 5, 3121; T. Gao, B. Wang, B. Ding, J. k. Lee, P. W. Leu, *Nano Lett.* 2014, 14, 2105). The balance between $R_s$ and T may be achieved by tailoring the thickness of the conductive material and the spatial distance between visually perceptible opaque features.

Without wishing to be bound to any particular theory, these conventional multi-material architectures, however, may show poor stretchability (i.e., $\varepsilon_{max}$ about 10-50%) and fail mechanically (e.g., rupture) due to out-of-plane deformation of the intrinsically inextensible metal mesh.

In recent years, patterned arrays of Ga-based liquid metal alloy (e.g., eutectic gallium-indium; EGaIn) on elastomeric substrates have been explored as an alternative to solid-state metals for highly stretchable circuit wiring (see M. D. Dickey, *Adv. Mater.* 2017, 29, 1606425; M. Kubo, X. Li, C. Kim, M. Hashimoto, B. J. Wiley, D. Ham, G. M. Whitesides, *Adv. Mater.* 2010, 22, 2749; J. W. Boley, E. L. White, G. T. C. Chiu, R. K. Kramer, *Adv. Funct. Mater.* 2014, 24, 3501), and liquid-phase robotics (see A. Chiolerio, M. B. Quadrelli, *Adv. Sci.* 2017, 4, 1700036). Lithographically patterned grids of 20 μm wide LM traces on a PEDOT:PSS substrate have been shown to exhibit a strain limit of $\varepsilon_{max}$ about 40% and sheet resistance of $R_s$=2.3 Ω/sq. (see Y. G. Moon, J. B. Koo, N. M. Park, J. Y. Oh, B. S. Na, S. S. Lee, S. D. Ahn, C. W. Park, *IEEE Trans. Electron Devices* 2017, 64, 5157). These grids yield a high transmittance of about 88% due to the large trace pitch (i.e. low LM filling fraction), which may result in large openings for light to pass through. While invisible at close distance (e.g. on a contact lens), grids with these trace dimensions may be seen when placed at a natural reading distance (see R. L. Levien, presented at *Electronic Imaging* 2004, California, 12, 2003). Without wishing to be bound to any particular theory, it is believed that is because 20 μm-wide opaque traces with a 400 μm pitch (i.e. larger than the grating acuity threshold of 75-100 μm (see C. A. Curcio, K. R. Sloan, R. E. Kalina, A. E. Hendrickson, *J. Comp. Neurol.* 1990, 292, 497)) on a transparent substrate may have sufficient contrast to be visually resolved by the eye (see FIG. 1). Therefore, such circuits may be unsuitable for applications in touch screens and electronic displays that may benefit from high optical clarity over a complete focal range. Liquid metal patterns having pitch (about 2 μm) below the grating acuity threshold of human eyes have been demonstrated in the past with stamp lithography (see B. A. Gozen, A. Tabatabai, O. B. Ozdoganlar, C. Majidi, *Adv. Mater.* 2014, 26, 5211). However, the high trace density resulted in a low transmittance and the patterning method has not been shown to be compatible with large-area circuit fabrication. The facile fabrication of optically clear, large-area, highly transparent LM circuitry with feature size below the threshold of visual perception remains a challenge within the field (see I. D. Joshipura, H. R. Ayers, C. Majidi, M. D. Dickey, *J. Mater. Chem. C* 2015, 3, 3834; M. A. H. Khondoker, D. Sameoto, Smart Mater. Struct. 2016, 25, 093001).

Figure 11A:
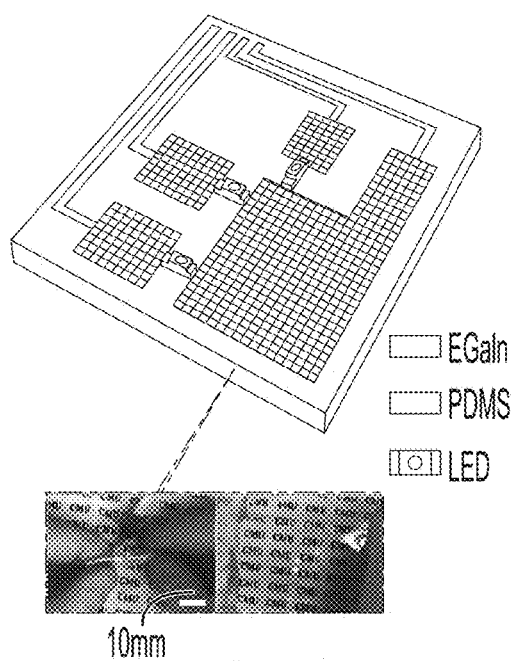
FIG. 11A illustrates a schematic of optically clear electronics comprised of grid-like liquid metal circuitry and integrated microelectronic components; (inset) representative circuit showing an exceptional combination of mechanical deformability, electrical functionality, and optical transparency.
Figure 11B:
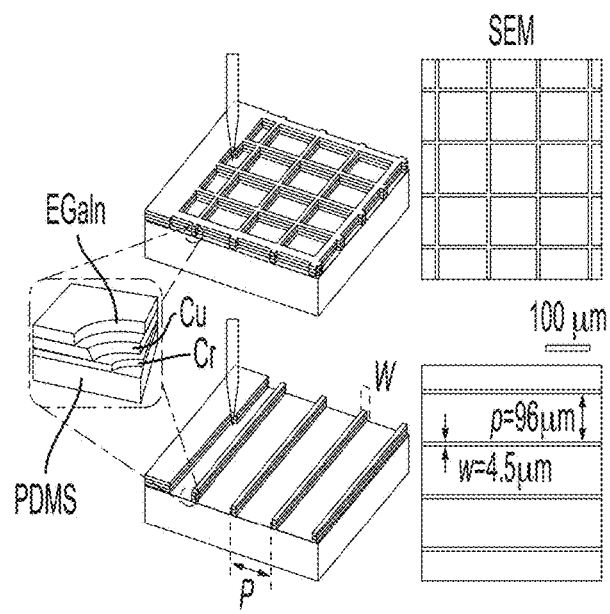
FIG. 11B illustrates schematic and SEM images of the square grid and parallel line patterns of 4.5 µm wide EGaIn traces; the liquid metal patterns are patterned by microscale laser ablation of the thin-film liquid metal/copper/chromium architecture on a PDMS substrate.

This disclosure generally describes materials architecture and rapid microfabrication techniques for generating optically clear LM circuits (FIG. 11A) that have a combination of low resistivity (e.g., $\rho=1.77\times10^{-6}$ Ω·m) and sheet resistance (e.g., $R_s=2.95$ Ω/sq), high strain limit (e.g., $\varepsilon_{max}>100\%$), high transparency (e.g., up to T=85.3% at 550 nm), and/or low trace width (e.g, w≥4.5 μm). The circuits are directly patterned on a transparent polydimethylsiloxane (PDMS; Sylgard 184, Dow Corning) elastomer substrate with ablative laser micromachining. To help adhere the EGaIn and PDMS, a "bi-phasic" architecture may be utilized in which a thin metal film (e.g., sputter deposited chromium/copper) is coated on the PDMS prior to EGaIn deposition and patterning (see G. Li, X. Wu, D.-W. Lee, *Sens. Actuators*, B 2015, 221, 1114; H. J. Kim, T. Maleki, P. Wei, B. Ziaie, J. Microelectromech. Syst. 2009, 18, 138; A. Hirsch, H. O. Michaud, A. P. Gerratt, S. de Mulatier, S. P. Lacour, *Adv. Mater.* 2016, 28, 4507). Referring to FIG. 11B, picosecond laser ablation was optimized for clean subtractive processing of metal films into conductive grid lines as narrow as 4.5 μm placed at a pitch of less than 100 μm to provide a visually imperceptible pattern having high transparency for typical reading distances and lighting conditions. The fabricated LM wiring may be readily interfaced with conventional circuit components (e.g. lead wiring, packaged microelectronics, or LED chips) to enable optically clear digital electronics. The stretchable electronics described herein may not be visible when placed (i) over text, (ii) in low contrast and backlit conditions, and (iii) high contrast and frontlit conditions (see FIG. 11C). Compared with conventional LM patterning, the CAD/CAM-compatible laser direct writing method described herein may provide rapid prototyping of optically transparent circuits with LM traces that are visually imperceptible for any prescribed focal distance. While conventional electronics may demonstrate either invisible traces (i.e. linewidth<6 μm & pitch<100 μm) (see B. A. Gozen, A. Tabatabai, O. B. Ozdoganlar, C. Majidi, *Adv. Mater.* 2014, 26, 5211) or a high optical transmittance (T≥80%) (see Y. G. Moon, J. B. Koo, N. M. Park, J. Y. Oh, B. S. Na, S. S. Lee, S. D. Ahn, C. W. Park, *IEEE Trans. Electron Devices* 2017, 64, 5157), the grid-like conductors described herein demonstrate both invisible traces and high optical transmittance (see FIG. 11D).

Results and Discussion

Liquid metal conductors were fabricated with a variety of trace widths in order to address the following: (i) validate an optimal fabrication method by comparing electrical, mechanical, and electromechanical properties of 20 μm-wide LM traces with measurements from previous studies (see Y. G. Moon, J. B. Koo, N. M. Park, J. Y. Oh, B. S. Na, S. S. Lee, S. D. Ahn, C. W. Park, *IEEE Trans. Electron Devices* 2017, 64, 5157), (ii) confirm that optical transmittance is governed by fraction of the substrate area covered by LM and is virtually independent of the trace width, and (iii) establish that the influence of trace width on optical clarity of LM conductor depends in the context of various visual conditions (e.g. focal distance, contrast, lighting).

Electrical & Electromechanical Characterization

Liquid metal conductors fabricated with ablative laser processing as generally described herein. Parallel line arrays of 20 μm-wide LM traces with 500 μm pitch (LM filling fraction, ø=3.8%) were patterned over a 7×7 mm² area on PDMS substrates by scanning a Nd:YAG laser (ProtoLaser U3; LPKF Laser & Electronics AG) of 355 nm wavelength to selectively remove the metal film while minimizing substrate damage. The use of a 355 nm Nd:YAG laser to pattern EGaIn on a soft elastomer substrate for the purposes of non-transparent hybrid LM-microchip electronics had previously been reported (see T. Lu, E. J. Markvicka, Y. Jin, C. Majidi, *ACS Appl. Mater. Interfaces* 2017, 9, 22055). The metal conductors fabricated with ablative laser processing as generally described herein may be compared to the characterization results of laser-processed LM patterned conductors with LM conductors comprised of 20 μm-wide traces defined by non-ablative techniques (e.g. photolithography (see Y. G. Moon, J. B. Koo, N. M. Park, J. Y. Oh, B. S. Na, S. S. Lee, S. D. Ahn, C. W. Park, *IEEE Trans. Electron Devices* 2017, 64, 5157)). The measured initial sheet resistance ($R_s$=1.7 Ω/sq) of the laser processed LM parallel line grid is smaller than the 2.3 Ω/sq value (see M. D. Dickey, *Adv. Mater.* 2017, 29, 1606425) measured in the lithographically-defined square grids. This is in spite of having 2.5× less area fill fraction—i.e. ø=4% (straight-line grid pitch=500 μm) for the laser-patterned sample versus ø=10% (square grid pitch=400 μm) for the sample in M. D. Dickey, Adv. Mater. 2017, 29, 1606425. Without wishing to be bound to any particular theory, this suggests that the thermal ablative laser process does not degrade the electrical properties of the EGaIn alloy (for example, due to over-ablation, excessive gallium oxidation, etc.) and has potential as a reliable method for LM grid patterning.

Figure 12A:
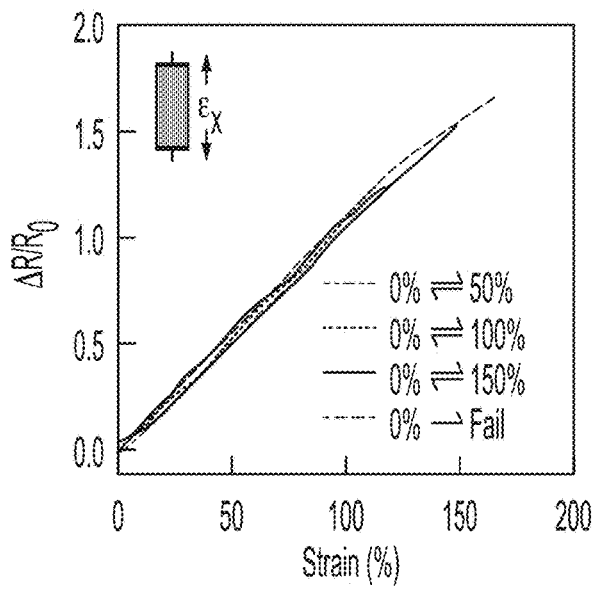
FIGS. 12A-D illustrate electromechanical response of laser patterned liquid metal conductor as a function of strain applied in the direction parallel to the trace (FIG. 12A) length ($\varepsilon x$, strain applied in longitudinal direction) and (FIG. 12B) width ($\varepsilon y$, transverse strain). In both (FIG. 12A) and (FIG. 12B) the maximum applied strain increases in each consecutive cycle until failure.
Figure 12B:
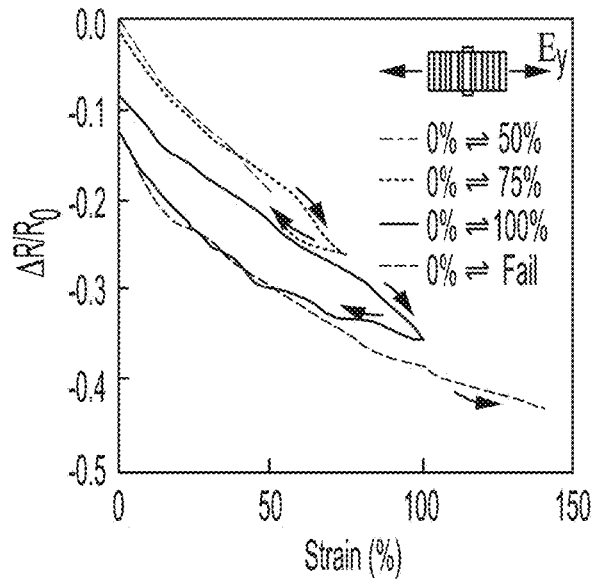

A typical evolution of the relative change in resistance ($\Delta R/R_0$) of the fabricated LM conductor as a function of strain applied along the trace length (longitudinal strain, Ex) and width (transverse strain, $\varepsilon_y$) is presented in FIGS. 12A and 12B, respectively. In the first cycle, the sample was first stretched by 50%, which is well below the strain limit of pristine PDMS substrate, εPDMS about 165% (see FIG. 7 for mechanical stress-strain data) and then relaxed to its original length. In each consecutive cycle, the strain is increased until a mechanical failure is observed. The optical images of laser patterned biphasic metallic grid (liquid metal/copper/chromium) and copper/chromium thin-film at different elongation strains in the longitudinal and transverse directions, and when cycled back to the relaxed state in both cases are presented in FIGS. 4A and 4B. In the case of longitudinal elongation (FIG. 12A), the relative change in resistance increases linearly with the applied strain (slope about 1). After all three incremental strain cycles, the resistance returned to the initial value ($R_0$=1.7Ω) upon relaxing. It should be noted that $R_0$ shares the same magnitude as sheet resistance ($R_s$) since $R_s=R_0\times\{width\}/\{length\}$ and the sample has square dimensions. The sample mechanically failed at $\varepsilon_x$=165% strain, which is within the range of strain limit values measured for pristine PDMS (see FIG. 7). Furthermore, the electromechanical response of the fabricated samples were similar to the previous work (see Y. G. Moon, J. B. Koo, N. M. Park, J. Y. Oh, B. S. Na, S. S. Lee, S. D. Ahn, C. W. Park, *IEEE Trans. Electron Devices* 2017, 64, 5157), where about a 55% change in resistance had been reported at a 60% elongation strain. Interestingly, resistance was observed to decrease when the sample was stretched in the transverse direction (FIG. 12B). Without wishing to be bound to any particular theory, this may be attributed to the incompressibility of the elastomer and a "Poisson's effect" that results in a decrease in trace length during transverse stretch. However, transverse stretch also results in significant hysteresis, which is most pronounced for strains at least 75% and may be likely related to the permanent wrinkling of the underlying copper/chromium thin-film at these high strains (evident in the $\varepsilon_y'$=0% panel of copper/chromium thin film in FIG. 4B). Under transverse stretching, the sample failed mechanically at a strain value of $\varepsilon_y$=140%. Overall, the results in FIGS. 12A and 12B provide further evidence that laser ablation is a reliable patterning method that does not significantly alter the intrinsic properties of the PDMS or EGaIn.

Figure 12C:
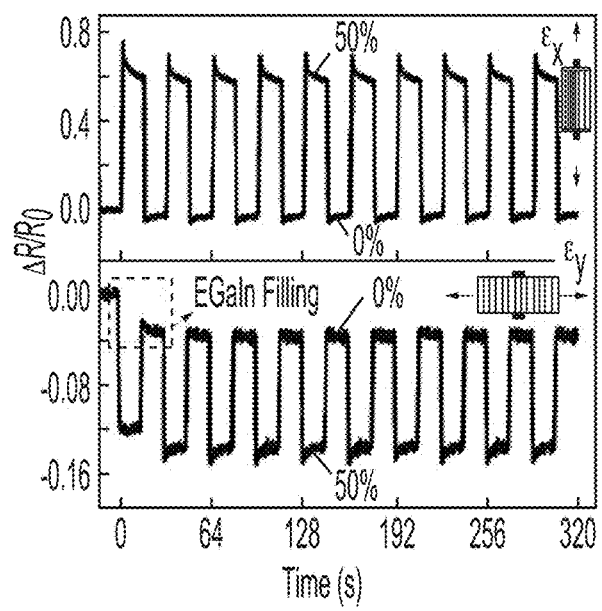
Figure 12D:
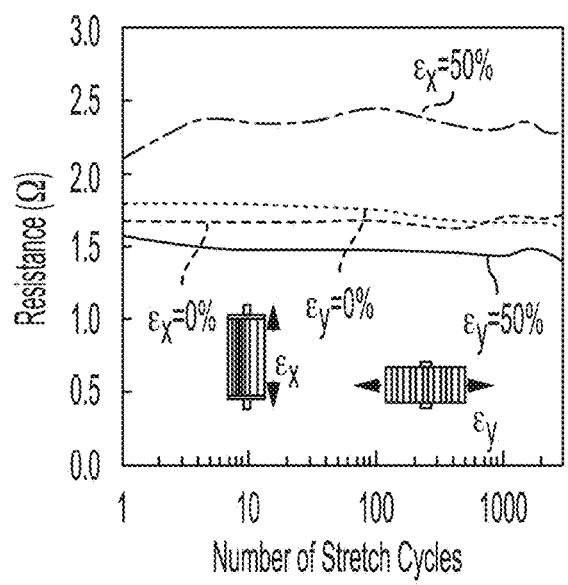

As shown in FIG. 12C, the LM conductor demonstrates largely consistent behavior when cyclically strained between ε=0% and 50% over multiple loading cycles. As shown in FIG. 12A, there is no evidence of significant electromechanical hysteresis for samples loaded in the longitudinal direction while such hysteresis is evident for transverse loading. However, this transverse hysteresis is associated with a small decrease in resistance (3%) after the first loading cycle, which we believe arises from the permanent wrinkling of the underlying copper/chromium adhesive thin-film. For subsequent loading cycles, the electromechanical response remains stable (shown in FIG. 12D for 3000 cycles). The results of the cyclical study suggest that the laser writing process provides a mechanically robust circuit without unduly influencing the intrinsic mechanical, electrical, or electromechanical properties of the EGaIn-PDMS architecture.

Optical & Optomechanical Characterization

Having established the consistency in materials performance (sheet resistance, strain limit, electromechanical coupling) between direct laser ablation and other LM-patterning techniques, we next set out to engineer visually imperceptible LM circuitry with reduced trace width. For the length-scales of interest, film transmittance (T) was evaluated by ignoring diffraction effects and simply following the area fill fraction (ø) of the opaque LM according to the relationship T=(1–ø) $T_{PDMS}$. Here, $T_{PDMS}$ is the transmittance of the bare PDMS and ø was estimated from the LM wire width, w, and grating period (pitch) p, e.g. ø=w/p for the case of parallel lines. The value for $T_{PDMS}$ was obtained by measuring the optical transmittance through a PDMS substrate in which the bi-phasic metal coating (i.e. EGaIn—Cu—Cr) is fully removed with the same laser parameters used for line patterning. Without wishing to be bound to any particular theory, it is believed that calculated in this way, the transmittance through the grated LM structure improved asymptotically towards 89% with increasing ø relative to the bare PDMS transmittance.

Figure 11C:
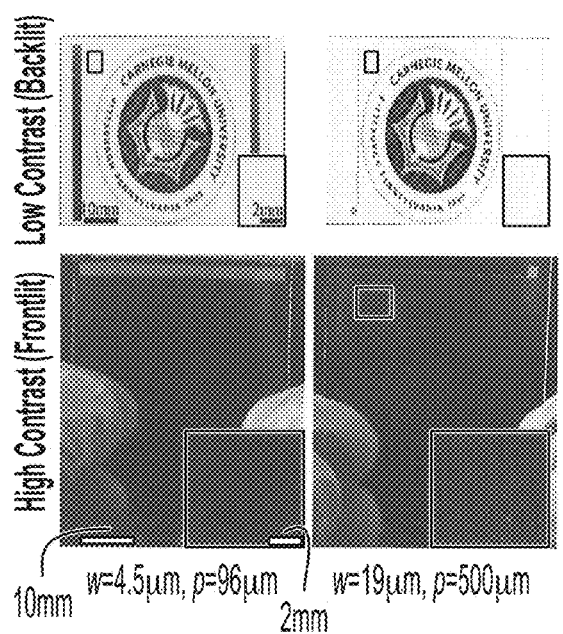
FIG. 11C illustrates photographs of parallel line pattern with line widths (w)/pitches (p) of 4.5 µm/96 µm (left) and 20 µm/500 µm (right) under backlit (low contrast) and frontlit (high contrast) conditions; the grated pattern of 20 µm wide liquid metal traces is resolved in both high and low contrast conditions, whereas the pattern of 4.5 µm wide traces is visually imperceptible.
Figure 11D:
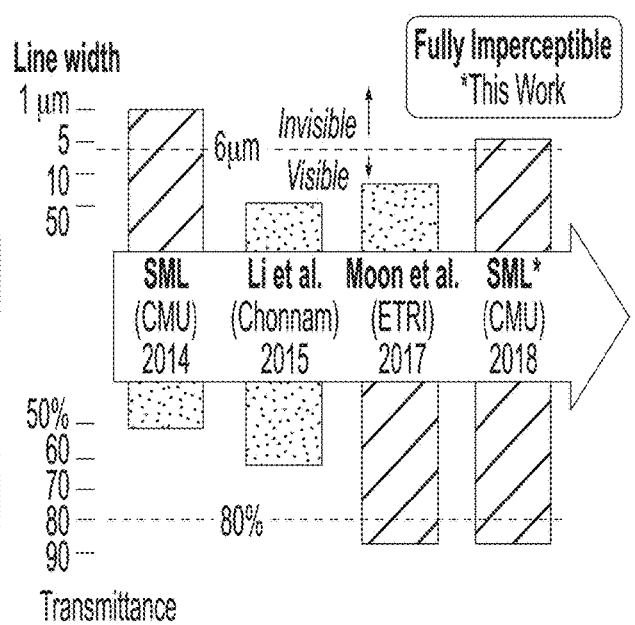
FIG. 11D illustrates progress in optically transparent and stretchable liquid metal circuits showing past and current achievements in improving optical transmittance and reducing trace linewidth and pitch to below the threshold for visibility under general reading distances and lighting conditions of the human eye.

In addition to demonstrating high transmittance, the opaque LM wire pattern must not be resolvable by the unaided eye under lighting conditions that are typical for the prescribed applications. This was addressed by narrowing the LM wire width with a higher resolution laser ablation process, centered on a short-pulsed laser (Lumera, Hyper Rapid 50; pulse duration=12 ps) (see K. Sugioka, Y. Cheng, *LIGHT-SCI. ADPL.* 2014, 3, e149) and high-resolution motion stages. LM patterns were generated with LM line widths (w) as small as 4.5 μm and the grating period (p) in a range of 17.5 to 96 μm, which correspond to LM filling fractions of ø=26.6% to 4.5%, respectively (see FIG. 5 for grating parameters). FIG. 11C shows optical images of two samples with w=4.5 μm and p=96 μm (left) and w=19 μm and p=500 μm (right), where the wire grid pattern is visually imperceptible only for the 4.5 μm wire width under both high and low contrast conditions.

A second set of parallel line arrays of 50 μm-wide LM wires with periodicity ranging from 125 to 500 μm, which correspond to ø=42% to 10%, respectively, may be fabricated to validate the theoretical model for transmittance. The reference transmittance of the bare PDMS substrate, following full laser removal of metal coating, yielded $T_{PDMS}$~89%, determined for an 18 cm×15 cm area ablated by the Lumera and LPKF laser systems. The surface topography maps of the laser-exposed PDMS surface are obtained with atomic force microscopy (AFM) and shown in FIGS. 10A-C. In these reference samples, the laser processes optimized for 4.5 μm and 50 μm straight-line gratings were applied by the Lumera and LPKF laser systems, respectively, and further details on the $T_{PDMS}$ measurement and PDMS surface quality are presented in FIG. 3A, which shows the optical transmittance measured through the grated patterns of 4.5 μm and 50 μm-wide traces as a function of varying LM filling fraction, which closely follow each other as well as fractional LM area (dashed line) calculated without the aid of data fitting.

Figure 13A:
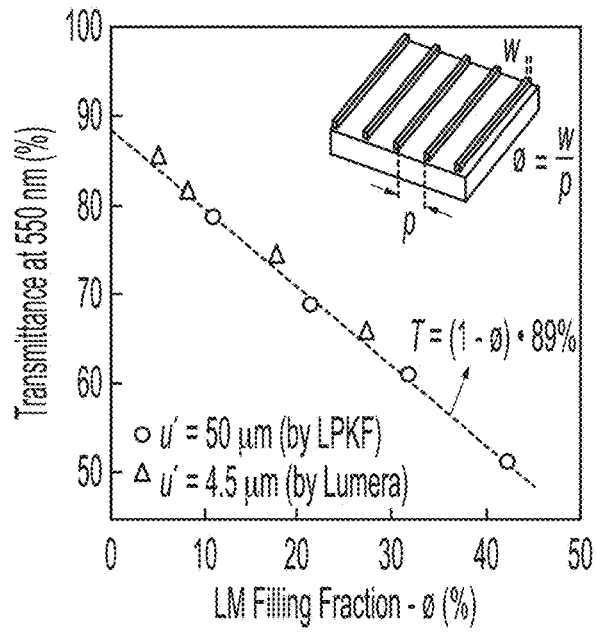
FIG. 13A illustrates transmittance at 550 nm wavelength through liquid metal grating patterns of 4.5 and 50 µm wide traces as a function of EGaIn filling fraction ($\varphi$) fabricated with the LPKF and Lumera laser systems, respectively. For both cases, the measured transmittance (markers) decreases linearly with the increase in liquid metal filling fraction and is in strong agreement with the open-area model (dashed line; no data fitting).
Figure 13B:
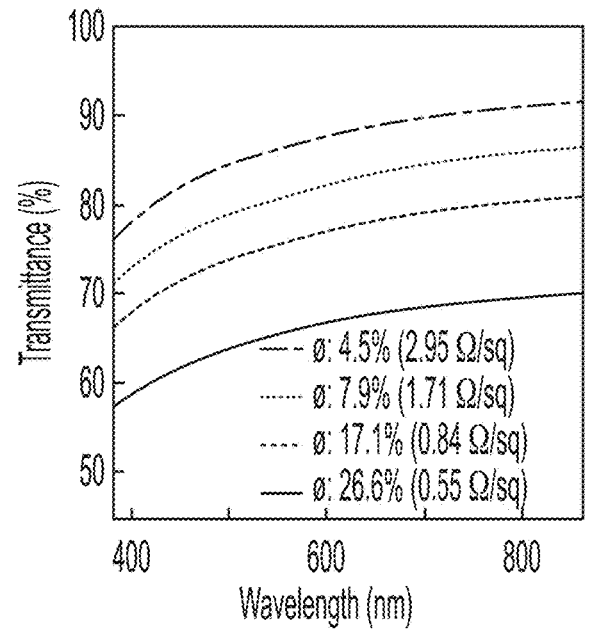
FIG. 13B illustrates transmittance spectra of the 4.5 µm liquid metal grating patterns for various EGaIn filling fractions over the complete visible wavelength range.

Spectral dependence (wavelength: 380-860 nm) of the optical transmittance is plotted in FIG. 13B for the case of the visually imperceptible LM-elastomer conductors (about 4.5 μm-wide traces). These results show respectable optoelectronic responses (T=85.3% at 2.95 Ω/sq, T=81.7% at 1.71 Ω/sq, T=74.3% at 0.84 Ω/sq and T=65.6% at 0.55 Ω/sq) for an increasing filling fraction of liquid metal from 4.5% to 26.6%. The nearly flat spectra show that direct laser writing does not introduce specific wavelength losses across the visible band. The data show the electrical conductivity and optical transmittance to both rise monotonically as expected with the LM filling fraction. Thus, the filling area fraction model can be used to design the pattern geometry for desired optoelectronic performance suited to different applications.

Figure 13C:
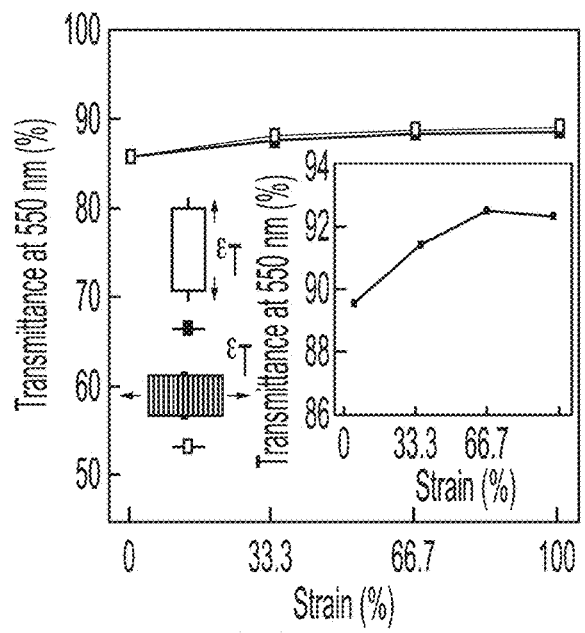
FIG. 13C illustrates optomechanical response of the patterned EGaIn conductor with a baseline transmittance of 85.3% (grating: w=4.5 µm, p=96 µm) under longitudinal and transverse strain showing the 550 nm wavelength transmittance versus strain. A slight (about 3.4%) increase in the transmittance of the liquid metal conductor under the applied strain is directly related to the increase in transmittance of bare PDMS surface between the liquid metal grid lines under tensile loading. Optomechanical response of bare PDMS substrate in which the biphasic metal coating has been fully ablated using the grating processing parameters is presented in the inset for comparison.
Figure 13D:
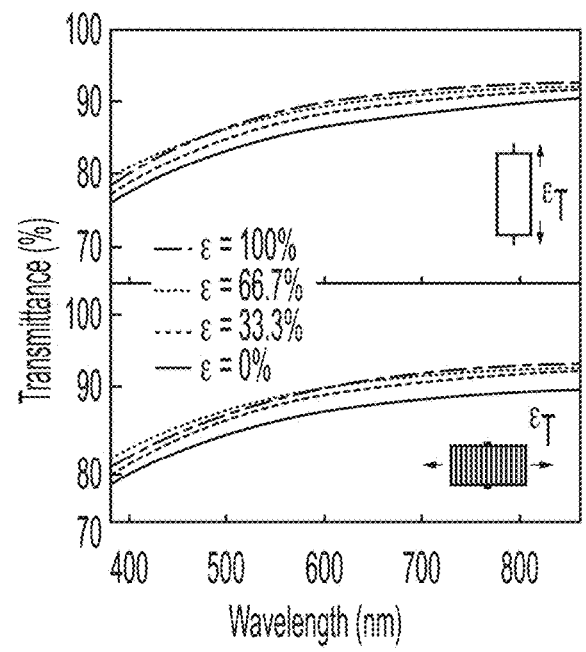
FIG. 13D illustrates full spectral response of EGaIn film (grating: w=4.5 µm, p=96 µm) under various strain values.
Figures 13E, 13F:
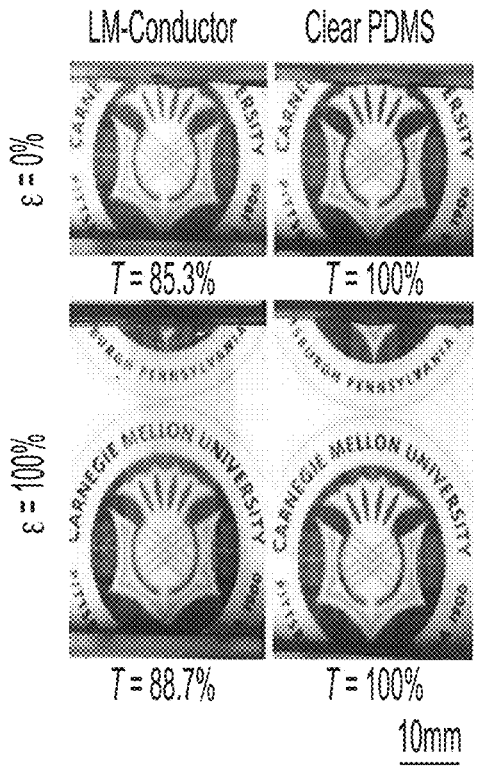
FIG. 13E illustrates optical images of visually imperceptible liquid metal/conductor (grating: w=4.5 µm, p=96 µm) and clear PDMS film in the relaxed state and at 100% longitudinal strain.
FIG. 13F illustrates LM grating parameters fabricated by two laser systems shown in FIG. 13A.

FIG. 13C shows the optomechanical response of the LM conductor selected with the highest initial transmittance (LM grating: w=4.5 μm, p=96 μm; T=85.3%), presenting the transmittance at the most perceptible wavelength, λ=550 nm, as a function of applied strain in the longitudinal and transverse directions. A small increase in the transmittance (3.4%) from 85.3% to 88.8% is observed with the increase in both types of applied strain. This is likely related to the optomechanical response of the bare PDMS surface between the LM grid lines, which was measured for samples in which the biphasic metal coating was fully ablated using the same laser processing parameters (see FIG. 13C inset). Transmission response over the full visible wavelength at various peak strains are shown in FIG. 13D and indicate that there is no significant optomechanical coupling with either longitudinal or transverse stretching. The left images in FIG. 13E show a LM sample with an "invisible" (i.e. visually imperceptible) parallel-line grating with an optical transmittance of T=85.3% and 88.7% in the relaxed (ε=0%) and stretched states (ε=100%), respectively. For comparison, optical images of a pristine PDMS substrate (no laser processing) are shown on the right with nearly 100% transmittance under the same conditions.

Lastly, AFM may be used to measure the thickness t of the biphasic liquid metal/copper/chromium traces. This enables an estimate the effective volumetric resistivity p based on the measured sheet resistance $R_s$=p/t of the conductive film. Based on the scan presented in FIG. 9B, the total film thickness is 600 nm (120 nm for the copper/chromium layer and 480 nm for the liquid metal coating). This implies that the T=85.3% sample, which has a sheet resistance of 2.95 Ω/sq, has a resistivity of $1.77 \times 10^{-6}$ Ω·m. This low effective resistivity provides further evidence that the thermal ablative laser process does not degrade the intrinsic electrical properties of EGaIn or the biphasic metal architecture.

Representative Applications

Figure 14A:
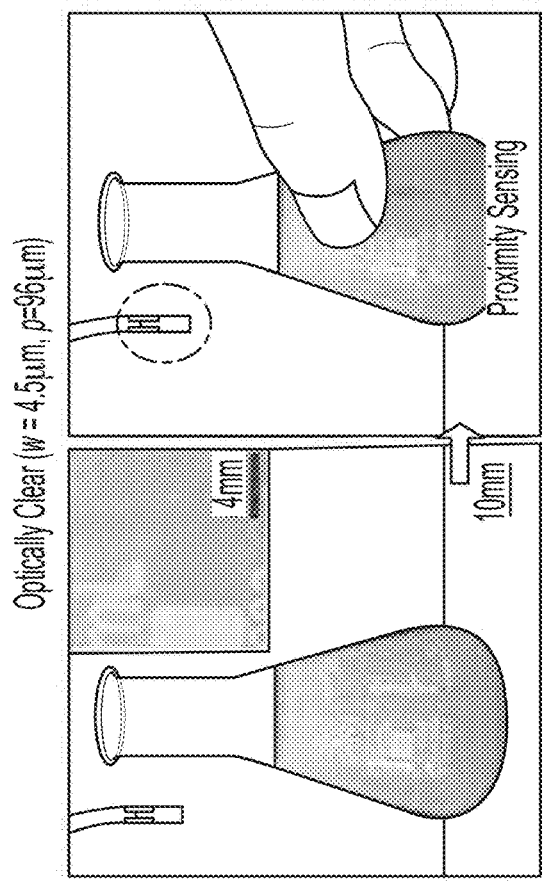
FIG. 14A illustrates proximity sensor using optically clear (w=4.5 µm, p=96 µm) and visually perceptible (w=19 µm, p=500 µm) conductor lines.

To demonstrate the potential of the present devices as soft transparent circuits in emerging "electronic skin" applications, several representative cases are illustrated. The first is an optically clear proximity sensor that can be placed on surfaces without causing visual interference. The transparent conductive film serves as a capacitive electrode for proximity sensing of a hand, triggering a capacitive touch sensor (CAP 1188, Microchip) to light up a light emitting diode (LED). The purpose here is to demonstrate electronic functionality on a curved surface while comparing the optical quality of circuits having 4.5 μm and 20 μm wide traces (pitch=96 μm, 500 μm, respectively). Both sensors are conformably bonded onto the curved surface of a flask using the inherent tackiness of the PDMS substrate. As demonstrated in FIG. 14A, both proximity sensors detect the proximity of the hand to light the LED with equal success rates, indicating no difference in the functionality of each LM conductor. However, the fully imperceptible LM sensor (4.5 μm wide wires) enables visual inspection of the hazardous material without obstruction.

Figure 14B:
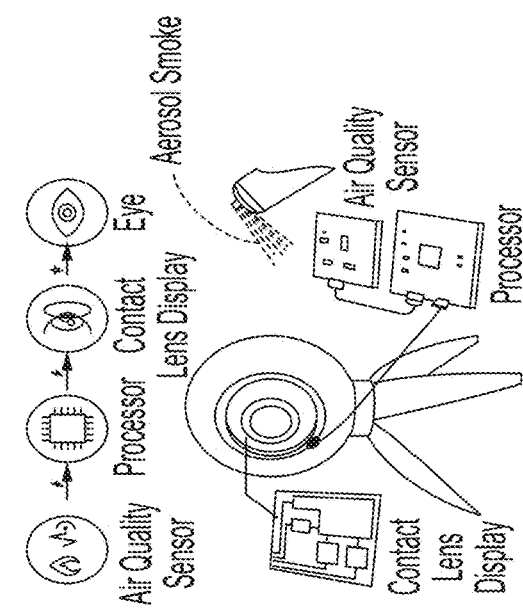
FIG. 14B illustrates block diagram and schematic of air quality monitoring system composed of a contact lens display based on an LM circuit, an eyeball camera, an air quality sensor, and a microprocessor.
Figure 14C:
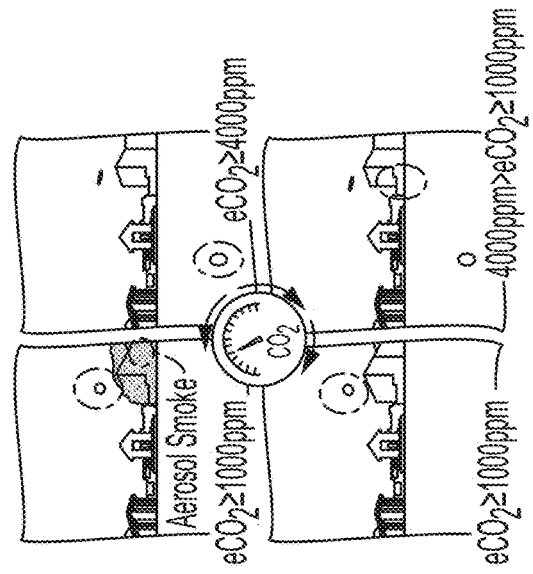
FIG. 14C illustrates response sequence of air quality ($CO_2$) measurement corresponding to "SAFE"-green, "DANGEROUS"-red, "ALERT"-blue and "SAFE"-green. LED coloring is set according to $eCO_2$ thresholds set at less than 1000 ppm for "SAFE" and greater than 4000 ppm for "DANGEROUS."

The electrical functionality and compatibility with a curved surface are also demonstrated with a "smart contact lens" that can be used to display local air quality (FIGS. 14B and 14C). The circuit was mounted on a spherical camera to mimic a biological contact lens on the human eye. The circuit is visual imperceptible with 20 μm wide traces because the surface of the camera is outside of its focal plane to illustrate the importance of application context when selecting appropriate trace dimensions. To demonstrate the air monitoring functionality of the circuit, the smart lens is sprayed with aerosol smoke containing carbon dioxide ($CO_2$) to mimic hazardous air quality. The air quality sensor (CCS811; AMS) detects the $CO_2$ concentration and reports an "equivalent calculated" carbon dioxide measure ($eCO_2$) to the microprocessor (ATmega328; Microchip). The microprocessor then illuminates an LED in the contact lens, corresponding to a designated air quality status. As shown in FIG. 14C, before spraying, $eCO_2$ is less than 1000 ppm (threshold), corresponding to a green LED with an air quality status of 'SAFE'. After spraying, the $eCO_2$ count increases dramatically (>4000 ppm) and triggers the red LED to light up as a 'DANGEROUS' indicator. With the diffusion of $CO_2$ to the environment, $eCO_2$ decreases and the signal switches from red to blue ('ALERT') and finally back to green. The camera is able to record images through the LM circuit wiring without visual interference (only the embedded LED chips can be seen) due to its high optical transparency (FIG. 14C).

CONCLUSION

Transparent conductors with high elastic deformability and transparency typically suffer from significant electromechanical coupling and/or hysteresis. Here, we report a materials architecture that overcomes this constraint and exhibits a unique combination of opto-electromechanical properties and is also well below the threshold for visual perception. The exceptional set of properties was accomplished with a laser micromachining process developed for high-resolution line patterning of liquid-phase EGaIn alloy on a soft and clear silicone elastomer. The low sheet resistance ($R_s$=2.95 Ω/sq; resistivity=$1.77 \times 10^{-6}$ Ω·m), high transparency (T>85% at 550 nm), high strain limit ($\varepsilon_{max}$>100%), and visual imperceptibility demonstrated here have never been observed before in other material systems. Moreover, the experimental results of transmittance were found to agree with predictions based on the geometry of traces without the aid of data fitting. Such simple modeling offers flexible tailoring of pattern design for desired optoelectronic responses. In addition, the results of cyclic tests demonstrated the mechanical robustness of transparent liquid metal-elastomer systems. The combination of properties demonstrated here are attractive for enabling new applications in "second skin" wearable computing, human-computer interaction, and soft robotics that depend on soft, elastic, and optically transparent functionality.

The transmission and conductivity of the may be stretchable electronics described herein described by a figure of merit defined as $Z=T^{10}/R_s$ (see G. Haacke, *J. Appl. Phys.* 1976, 47, 4086-4089). For the samples presented here, Z is as high as 0.07 $\Omega^{-1}$, which is comparable to ITO films but short of the highest values reported (see Z. Chen, W. Li, R. Li, Y. Zhang, G. Xu, and H. Cheng, *Langmuir* 2013, 29, 13836-13842). The transmission of the laser patterned LM conductor could potentially be improved by custom designing the laser scan path and optimizing the overlap between the adjacent scans (see FIG. 10). Another area of possible improvement relates to the speed and efficiency of fabrication. Currently, the subtractive laser-based fabrication process requires only 600 nanometers of metal film thickness to form conductive grid lines, thus ensures limited material waste during the commercial processing of large area circuits (i.e. 0.06 grams of waste per 4 inch×4 inch liquid metal conductor). Material efficiency could be further improved with a thinner LM film, although this would be at the sacrifice of reduced conductivity. The circuit writing speed, which is currently 5 cm-s$^{-1}$ for single pulse aperture writing, can be increased dramatically by scaling to a higher repetition rate, using beam multiplexing, and adopting more powerful ultrafast lasers.

Experimental Section

Substrate Preparation: The substrates were prepared by first spin coating a layer of PVA (Polyvinyl alcohol 5 wt %; Ward's Science) onto a glass slide surface at 4000 rpm for 10 s. The film was dried in an oven at 70° C. for 30 s and then spin coated with PDMS (Sylgard 184, 10:1 ratio of base to curing agent; Dow Corning Corporation) at 600 rpm for 30 s. The thin layer of PVA was later used to release the final product, i.e., PDMS layer with patterned liquid metal (EGaIn, Ga 75%, In 25% by weight; Gallium Source LLC) from the glass slide. Next, the PDMS coating was vacuum cured at 70° C. for 1.5 hours to obtain a 150 µm-thick stretchable transparent substrate. To obtain a uniform thin layer of EGaIn, 20 nm-thick chromium and then 100 nm-thick copper layers were sputtered (Perkin Elmer 8L; PerkinElmer) onto the cured PDMS-glass substrates. The chromium coating served as the bonding layer between PDMS and copper. The copper coating formed an alloy with EGaIn when dipped in the liquid metal in the presence of sodium hydroxide solution (NaOH, 3 wt %) that was used to remove the oxide layers on copper and EGaIn to facilitate alloying. After 1 minute of dip coating, the excess EGaIn was first removed under gravity by vertically pulling the substrate out of EGaIn/NaOH pool, followed by spinning the sample on a spin coater at 4000 rpm for 60 seconds. Finally, the sample was washed by deionized water and isopropyl alcohol (99.5 wt %) for laser patterning. To fabricate liquid meta grids without copper/chromium underlayer, the liquid metal was directly roll-painted on PDMS substrate that resulted in about 1 µm thick LM coating.

Laser Patterning: All samples with EGaIn line width greater than 10 µm were patterned by a 355 nm Nd:YAG laser (ProtoLaser U3; LPKF Laser & Electronics AG) using two ablation passes. The first pass with higher energy drove the most signification ablation to remove liquid EGaIn and solid metal (copper and chromium), whereas, the second pass with lower energy cleaned the dust and EGaIn ablation residue that was left behind on the PDMS surface after the first pass. For the first scan, the laser spot size of 15 µm was scanned with 0.5 W power (Power density, J=0.28 MW/cm$^2$) at the repetition rate of 50 kHz, and mark speed of 150 mm/s, resulting in approximately 5 pulses per spot size. This laser ablation power was chosen such that the biphasic metal coating (LM-Cu—Cr) is completely removed with minimal damage to the exposed PDMS substrate (see FIG. 10 for LM patterning at different laser power densities). The same settings were applied for the cleaning step except with the power was reduced to 0.25 W (0.14 MW/cm$^2$).

To reduce the line width below 10 µm, a solid-state Nd:YVO$_4$ ultrafast laser (Lumera, Hyper Rapid 50) was used to shrink the heat affected zone and improve the pattern resolution. The 1064-nm fundamental laser output with 12-ps pulse duration and 500-kHz repetition rate was focused onto the sample by a plano-convex lens of 25-mm focal length to an 8-µm focus spot size (M$^2$: 1.22) and Gaussian beam shape. The lens and sample were mounted to a linear XYZ motion stage (Aerotech, ABL10150/ABL10100/ALS130) for programmable scanning that could be synchronized with an electronic laser shutter to selectively turn on laser exposure at the sample area that required metal removal. After testing several exposure conditions, a first scan for laser ablation was applied with scanning speed of 50 mm/s and the laser frequency down-counted to 50 kHz of 5-pulse burst trains, which results in five pulses arriving at 500-kHz rate. The pattern ablation was followed with a second cleaning pass that was applied with the same exposure parameters except for the laser pulse energy reduced from 0.7 µJ (0.3 MW/cm$^2$) for the first ablation scan to 0.5 µJ (0.2 MW/cm$^2$) for the second cleaning scan.

Optomechanical Coupling Measurement. For optomechanical coupling measurement, laser patterned samples were encapsulated with PDMS to secure EGaIn traces. Uncured PDMS was poured to cover the substrate surface and then cured in wire-up position (gravity helps to remove the excess PDMS) at 70° C. for 1.5 hours. Next, the sample was released from the glass substrate by scribing PDMS with a laser cutter (VLS3.50; Universal Laser System, Inc.) with the settings of 100% speed, 100% power and 1000 ppi followed by mechanical peeling. The encapsulated samples were mounted on an acrylic holder and stretched to desired strains (0, 33.3%, 66.7%, 100%). After stretching to the desired strain, the samples were removed along with clamps and mounted into a UV-VIS-NIR spectrometer (Perkin Elmer Lambda 900; PerkinElmer) to measure the transmittance across the 380 nm to 860 nm wavelengths. Clear PDMS film was used as the reference.

Electromechanical Coupling Measurement: To characterize electromechanical coupling in the laser-patterned samples, Velmex manual linear actuators were used to stretch samples to desired strains in the incremental steps of 5% strain (1 mm). The samples ends were clamped to the actuators with textured 3D printed grips. Two EGaIn pads of LM pattern were covered by EGaIn pools, which were connected to copper probes for sheet resistance measurement by a micro-ohm meter (HP 34420A, Hewlett-Packard). The EGaIn traces were encapsulated with PDMS layer. The extremely thin layer of PDMS above the EGaIn pool was punctured to connect copper probes for measurements.

Surface Roughness and LM grid thickness: The vertical thickness (height) of patterned LM grid and surface roughness of the exposed PDMS surface after the laser ablation of metallic thin-film is measured with NT-MDT atomic force microscopy by Spectrum Instruments. The surface roughness measurements on the LPKF and Lumera processed PDMS surfaces are carried out by the tapping-mode procedure, in which the driving frequency of the cantilever is adjusted around the resonance frequency of the cantilever (Nanoworld, NCHR-50). NT-MDT Hybrid tapping mode is used to map the surface of the LM grid and measure the thickness of LM trace. In hybrid mode, the tip enters a force interaction with the sample thousands of times per second. AFM height image and the cross-sectional view of patterned LM grid are presented in FIG. 9. Topography maps of Lumera and LPKF processed PDMS surfaces are shown in FIG. 10.

Proximity Sensor and Air Quality Monitoring: The imperceptible and transparent LM proximity sensors were wired to one of the channels of the capacitive touch sensor (CAP1188, Microchip). The corresponding channels LED driver was wired to an external LED to serve as a warning of possible danger to a human. An air quality sensor (CCS811, AMS) was used to determine the local air quality and warn the human of possible dangers. The sensor burn-in was performed for 48 hours when first received and for 20 minutes before every test as described within the datasheet to ensure accurate readings. Based on the equivalent $CO_2$ output from the sensor a warning was displayed to the wearer by illuminating an LED mounted within the transparent display. The local air quality was modified using aerosol smoke (ESL Smoke! in a Can, Interlogix). The capacitive touch sensor and air quality sensor was interfaced with a microcontroller (ATmega328, Microchip) using the $I^2C$ interface.

The following aspects are disclosed in the present invention:

Aspect 1. A stretchable and transparent electronic structure comprising: a stretchable elastomer layer; a metal alloying layer on top of the stretchable elastomer layer; and a liquid metal, wherein the structure is colorless and transparent when viewed under visible light.

Aspect 2. The structure according to any of the foregoing aspects, wherein the metal alloying layer is at least one of copper, gold, and silver.

Aspect 3. The structure according to any of the foregoing aspects, wherein the liquid metal is a metal alloy consisting essentially of gallium, indium, and copper and, optionally, tin.

Aspect 4. The structure according to any of the foregoing aspects, wherein the liquid metal comprises a conductive material that is liquid at a temperature from −20° C. to 40° C.

Aspect 5. The structure according to any of the foregoing aspects comprising a metal adhesion layer intermediate the stretchable elastomer layer and metal alloying layer.

Aspect 6. The structure according to any of the foregoing aspects, wherein the metal alloying layer comprises copper, the metal adhesion layer comprises chromium, and the liquid metal comprises gallium and indium.

Aspect 7. The structure according to any of the foregoing aspects, wherein the stretchable elastomer layer comprises one of a stretchable silicone layer and a stretchable fluoropolymer layer.

Aspect 8. The structure according to any of the foregoing aspects, wherein the structure is invisible to the human eye when viewed.

Aspect 9. The structure according to any of the foregoing aspects comprising a biphasic metal coating comprising conductive grid lines on less than 15% of total surface area of the top of the stretchable elastomer layer.

Aspect 10. The structure according to any of the foregoing aspects a plurality of laser patterned biphasic metallic grid lines having a thickness up to 600 nanometers and a width up to 6 micrometers.

Aspect 11. The structure according to any of the foregoing aspects comprising a plurality of laser patterned biphasic metallic grid lines having a width less than 5 micrometers and the structure comprises at least 80% transmittance.

Aspect 12. The structure according to any of the foregoing aspects, wherein the structure comprises at least 80% transmittance from 400-800 nanometers, a sheet resistance less than 10 Ohm/square, a volumetric resistivity less than $10^{-5}$ Ohm-meters, a Young's modulus from 0.01-10 MPa, and a strain limit less than 50%.

Aspect 13. A method of manufacturing a stretchable and transparent electronic structure, the method comprising laser patterning an electrically conductive material layer on a stretchable substrate to form a plurality of void spaces therein, wherein the electrically conductive material layer comprises biphasic metallic grid lines having a thickness up to 600 nanometers and a width up to 6 micrometers, wherein the structure comprises, based on the structure's total top surface area, up to 15% of the electrically conductive material layer and at least 85% void spaces, and wherein the structure is colorless and transparent when viewed under visible light.

Aspect 14. The method according to any of the foregoing aspects, wherein the laser patterning comprises a speed of at least 0.1 meter/second.

Aspect 15. The method according to any of the foregoing aspects, wherein the laser patterning comprises directing a laser at the electrically conductive material layer to form a pattern of the plurality of void spaces by laser etching or laser ablation.

Aspect 16. The method according to any of the foregoing aspects, wherein the laser patterning comprises directing a laser at the electrically conductive material layer to form a first pattern of the plurality of void spaces having a width up to 10 micrometers and a pitch up to 100 micrometers by laser etching or laser ablation.

Aspect 17. The method according to any of the foregoing aspects, wherein the laser comprises a wavelength of 355 nanometers, a power of 0.7 microjoules, a frequency of 500 kHz, a pulse duration of 10 nanoseconds, a spot size of 15 micrometers, and a scan speed of 50 mm/second, and a working distance of 103 millimeters.

Aspect 18. The method according to any of the foregoing aspects, wherein the laser comprises a wavelength of 1064 nanometers, a power of 0.5 microjoules, a frequency of 500 kHz, a pulse duration of 12 picoseconds, a spot size of 8 micrometers, and a scan speed of 50 mm/second, and a working distance of 25 millimeters.

Aspect 19. The method according to any of the foregoing aspects comprising: depositing a metal adhesion layer on a stretchable substrate; depositing a metal alloying layer on the metal adhesion layer; and alloying a liquid metal and the metal alloying layer to form the electrically conductive material layer; and ablating a pattern of the electrically conductive material layer to form the biphasic metallic grid lines having a thickness up to 600 nanometers and a width up to 6 micrometers; wherein the structure comprises at least 80% transmittance.

Aspect 20. The method according to any of the foregoing aspects, wherein the structure has at least 80% transmittance from 400-800 nanometers, a sheet resistance less than 10 Ohm/square, a volumetric resistivity less than $10^{-5}$ Ohm-meters, a Young's modulus from 0.01-10 MPa, and a strain limit less than 50%; and wherein the structure is invisible to the human eye when viewed in the substantial absence of UV light.

All documents cited herein are incorporated herein by reference, but only to the extent that the incorporated material does not conflict with existing definitions, statements, or other documents set forth herein. To the extent that any meaning or definition of a term in this document conflicts with any meaning or definition of the same term in a document incorporated by reference, the meaning or definition assigned to that term in this document shall govern. The citation of any document is not to be construed as an admission that it is prior art with respect to this application.

While particular embodiments have been illustrated and described, it would be obvious to those skilled in the art that various other changes and modifications may be made without departing from the spirit and scope of the invention. Those skilled in the art will recognize or be able to ascertain using no more than routine experimentation, numerous equivalents to the specific apparatuses and methods described herein, including alternatives, variants, additions, deletions, modifications and substitutions. This application including the appended claims is therefore intended to cover all such changes and modifications that are within the scope of this application.

The invention claimed is:

1. A method of manufacturing a stretchable and transparent electronic structure comprising a plurality of laser patterned biphasic metallic grid lines having a thickness up to 600 nanometers and a width up to 6 micrometers, the structure comprising a stretchable elastomer layer, a metal alloying layer on top of the stretchable elastomer layer, and a liquid metal, wherein the structure is colorless and transparent when viewed under visible light, the method comprising:
   depositing a metal adhesion layer on the stretchable elastomer layer;
   depositing the metal alloying layer on the metal adhesion layer; and
   alloying the metal alloying layer and the liquid metal to form an electrically conductive material layer; and
   laser patterning a pattern of the electrically conductive material layer to form the biphasic metallic grid lines.

2. The method of claim 1, wherein laser patterning comprises at least one of laser etching, laser ablation, electron beam machining or etching, ion beam milling or etching, roll forming, embossing, and lithography.

3. The method of claim 1, wherein laser patterning comprises at least one of laser etching and laser ablation.

4. The method of claim 1, wherein depositing the metal adhesion layer comprises at least one of physical vapor deposition, chemical vapor deposition, sputtering, atomic layer deposition, electrochemical deposition, spin coating, dip coating, and inkjet printing.

5. The method of claim 1, wherein depositing the metal alloying layer comprises at least one of physical vapor deposition, chemical vapor deposition, sputtering, atomic layer deposition, electrochemical deposition, roller deposition, thin film application, spin coating, dip coating, stencil printing, and inkjet printing.

6. The method of claim 1, wherein laser patterning comprises at least one of laser etching and laser ablation; and wherein depositing the metal alloying layer comprises sputtering.

7. The method of claim 1, wherein the metal adhesion layer comprises at least one of platinum (Pt), copper (Cu), gold (Ag), lead (Pb), niobium (Nb), palladium (Pd), platinum (Pt), nickel (Ni), chromium (Cr), manganese (Mn), vanadium (V), tin (Sn), aluminum (Al), tantalum (Ta), and iron (Fe).

8. The method of claim 1, wherein the stretchable elastomer layer comprises one of a stretchable silicone layer and a stretchable fluoropolymer layer.

9. The method of claim 1, wherein the metal alloying layer comprises at least one of platinum (Pt), copper (Cu), gold (Ag), lead (Pb), niobium (Nb), palladium (Pd), platinum (Pt), nickel (Ni), chromium (Cr), manganese (Mn), vanadium (V), tin (Sn), aluminum (Al), tantalum (Ta), and iron (Fe).

10. The method of claim 1, wherein the liquid metal comprises a metal alloy consisting essentially of gallium, indium, and, optionally, tin.

11. The method of claim 1, wherein the liquid metal comprises a conductive material that is liquid at a temperature from −20° C. to 40° C.

12. The method of claim 1, wherein the metal alloying layer comprises copper, the metal adhesion layer comprises chromium, and the liquid metal comprises gallium and indium.

13. A method of manufacturing a stretchable and transparent electronic structure comprising a plurality of laser patterned biphasic metallic grid lines having a thickness up to 600 nanometers and a width up to 6 micrometers, the structure comprising a stretchable elastomer layer, a metal alloying layer on top of the stretchable elastomer layer, and a liquid metal, wherein the structure is colorless and transparent when viewed under visible light, the method comprising laser patterning an electrically conductive material layer on the stretchable elastomer layer to form a plurality of void spaces therein, wherein the electrically conductive material layer comprises the liquid metal and at least one of the metal alloying layer and a metal adhesion layer, and wherein the electrically conductive material layer comprises the plurality of laser patterned biphasic metallic grid lines.

14. The method according to claim 13, wherein the structure comprises, based on the structure's total top surface area, up to 15% of the electrically conductive material layer and at least 85% void spaces, and wherein the structure is colorless and transparent when viewed under visible light.

15. The method of claim 13, wherein the structure comprises an area fraction of at least 10%, based on the structure's total top surface area.

16. The method according to claim 13, wherein the laser patterning comprises
   directing a first laser at the electrically conductive material layer to form a first pattern of the plurality of void spaces having a width up to 10 micrometers and a pitch up to 100 micrometers by at least one of laser etching and laser ablation; and
   directing a second laser at the electrically conductive material layer to form a second pattern of the plurality of void spaces having a width less than 10 micrometers by at least one of laser etching and laser ablation.

17. The method according to claim 13, wherein the first laser and the second laser comprise one of same wavelengths and different wavelengths.

18. The method according to claim 13, wherein the electrically conductive material layer comprises the metal adhesion layer comprising chromium and the liquid metal comprises gallium and indium, and wherein the stretchable elastomer layer comprises at least one of a stretchable silicone layer and a stretchable fluoropolymer layer.

19. The method according to claim 13, wherein the biphasic metallic grid lines comprise a thickness up to 600 nanometers and a width up to 6 micrometers; and wherein the structure comprises at least 80% transmittance from 400-800 nanometers.

20. The method according to claim 13, wherein the structure comprises a thickness from 5 micrometers to 10 cm, at least 80% transmittance from 400-800 nanometers, a sheet resistance less than 10 Ohm/square, a volumetric resistivity less than $10^{-5}$ Ohm-meters, a Young's modulus from 0.01-10 MPa, and a strain limit less than 50%; and wherein the structure is invisible to the human eye when viewed in the substantial absence of UV light.

\* \* \* \* \*